United States Patent
Charrier et al.

(12) 
(10) Patent No.: US 6,501,860 B1
(45) Date of Patent: Dec. 31, 2002

(54) DIGITAL SIGNAL CODING AND DECODING BASED ON SUBBANDS

(75) Inventors: Maryline Charrier, Rennes (FR); Felix Henry, Rennes (FR); Patrice Onno, Rennes (FR)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/232,215

(22) Filed: Jan. 19, 1999

(30) Foreign Application Priority Data

Jan. 19, 1998 (FR) ............................................. 98 00504
Jan. 19, 1998 (FR) ............................................. 98 00503
Apr. 27, 1998 (FR) ............................................. 98 05247
Apr. 27, 1998 (FR) ............................................. 98 05246

(51) Int. Cl.$^7$ .............................. G06K 9/36; H04N 7/12
(52) U.S. Cl. .................. 382/240; 382/239; 375/240.02; 375/240.11; 375/240.19
(58) Field of Search .............................. 382/232, 248, 382/239, 240, 230; 704/230; 375/240.02, 240.11, 240.03, 240.19, 240.18, 240.22, 240.24, 240.01

(56) References Cited

U.S. PATENT DOCUMENTS

| 5,905,819 A | * | 5/1999 | Daly ........................... 382/284 |
| 5,966,465 A | * | 10/1999 | Keith et al. .................. 382/232 |
| 5,974,181 A | * | 10/1999 | Prieto .......................... 382/232 |
| 6,031,940 A | * | 2/2000 | Chui et al. ................... 382/240 |

FOREIGN PATENT DOCUMENTS

| FR | 2 667 745 | 4/1992 | .......... H03H/17/02 |
| JP | 03165191 A | * 7/1991 | .......... H04N/7/133 |
| WO | WO96/34496 | 10/1996 | ............ H04N/7/30 |
| WO | WO97/17797 | 5/1997 | ............ H04N/7/50 |

OTHER PUBLICATIONS

Adaptive Image Coding Based on the Discrete Wavelet Transform, Jafarkhani et al., Proceedings of IEEE International Conference on Image processing, ICIP–94, vol. 3, 1994, pp. 343–347.*

Image Coding Using Wavelet Transforms and Entropy–Constrained Trellis–Coded Quantization, Sriram et al., IEEE transactions on Image Processing, vol. 4, No. 6, 1995, pp. 725–733.*

Nuri et al., "Spatially–Varying, Adaptive SubBand Image Coding," Int'l Conf. on Image Proc., vol. 2, pp. 373–376, IEEE, Sep. 1996.

Rinaldo et al., "An Image Coding Scheme Using Block Prediction of the Pyramid SubBand Decomposition", Proc. Int'l Conf. on Image Proc., vol. 2, No. Conf. 1, IEEE, Nov. 13, 1994.

(List continued on next page.)

Primary Examiner—Wenpeng Chen
(74) Attorney, Agent, or Firm—Fitzpatrick, Cella, Harper & Scinto

(57) ABSTRACT

The invention proposes a digital signal coding method including a step (E1) of analysing the digital signal (IM) into a plurality of frequency sub-bands, at least one first sub-band having a lower frequency and at least one second sub-band having a higher frequency, characterised in that it includes, for each second sub-band, the steps of:

dividing (E4) the second sub-bands into blocks ($B_{p,n}$), selecting (E9) first blocks which are to be coded by setting to a predetermined value and second blocks which are to be coded by trellis coded quantization, according to a selection criterion, linking (E16) the second blocks selected at the previous step in order to form a series of blocks, coding (E17) the series of blocks by trellis coded quantization of a series of coefficients extracted from the second blocks of the second sub-band.

17 Claims, 20 Drawing Sheets

OTHER PUBLICATIONS

Sampson et al., "Wavelet Transform Image Coding Using Lattice Vector Quantisation", Electronics Letter, vol. 30, No. 18, pp. 1477–1478, Sep. 1, 1994.

Sampson, et al., "Wavelet Lattice Quantization For Low Bit Rate Video Coding", Proc. Conf. on Communications, vol. 3, pp. 1423–1427, IEEE, Jun. 18, 1995.

Jourdan et al., "Edge–Preserving ADPCM and ECVQ Coding of Image Sub–Bands Using Subjective Criteria", Proc. Int'l Conf. on Image Proc., vol. 3, pp. 411–414, IEEE, Sep. 16, 1996.

Van Dyck et al., "Video Coding Using Entropy–Constrained Trellis Coding Quantization", Applications of Digital Image Proc. XVII, Procs. of SPIE–The Int'l Soc. For Optical Eng., pp. 119–130, Jul. 1994.

Park et al., "Sub Band Image Coding Using Block–Zero Tree Coding and Vector Quantization", IEEE Int'l Conf. on Acoustics, Speech, and Sig. Processing–Procs., vol. 4, NR. Conf. 21, pp. 2052–2055, IEEE, May 7, 1996.

* cited by examiner

DIGITAL SIGNAL CODING AND DECODING BASED ON SUBBANDS

The present invention concerns a digital signal coding device and method. It also concerns a decoding method and device corresponding to the coding method and device.

The purpose of coding is to compress the signal, which enables the digital signal to be transmitted, or respectively stored, thus reducing the transmission time or transmission rate, or respectively reducing the memory space used.

The invention is situated in the field of compression of digital signals with loss.

In a first aspect, breaking down a signal into frequency sub-bands before compressing it is known. The breakdown consists of creating, from the signal, a set of sub-bands which each contain a limited range of frequencies. The sub-bands can be of different resolutions, the resolution of a sub-band being the number of samples per unit length used for representing this sub-band. In the case of a digital image signal, a frequency sub-band of this signal can itself be considered to be an image, that is to say a bidimensional table of numerical values.

It should be noted that breaking down a signal into frequency sub-bands does not create any compression in itself, but makes it possible to decorrelate the signal so as to eliminate redundancy therefrom prior to the compression proper. The sub-bands are thus coded more effectively than the original signal.

A known method of coding a digital signal, in this case of a digital image, includes three main steps. The image is first of all broken down by a transformation into frequency sub-bands, then a scalar quantization of the coefficients thus obtained is performed. The quantized indices are finally coded by entropic coding without loss.

This method affords a high degree of compression of the signal. However, the ratio between the degree of compression and the coding error leaves room for improvement.

In the first aspect, the present invention aims to remedy the drawbacks of the prior art by providing a digital signal compression device and method which offers a high ratio of compression to distortion.

In second and third aspects, a known method of coding a digital signal, in this case of a digital image, is trellis coded quantization, which is described for example in the article entitled "Trellis Coded Quantization of Memoryless and Gauss-Markov Sources" by M. W. Marcellin and T. R. Fischer, which appeared in IEEE Transactions on Communications, Vol 38, Number 1, January 1990, as well as in the article "Universal Trellis Coded Quantization" by J. H. Kasner, M. W. Marcellin and B. R. Hunt, available by Internet at the address http://vail.ece.arizona.edu/Publications.html.

This method has the advantage of minimising the quantization error by virtue of the use of trellis coding.

In addition, in order to improve the ratio of compression to distortion, the inventors combined this method with another coding mode. In this case, blocks of the signal to be coded are allocated one or other coding mode, so as to select for each block the most appropriate coding mode, that is to say the one providing the highest ratio of compression to distortion.

Block here means a set of coefficients extracted from the signal in order to form a vector.

Coding by trellis coded quantization is applied to a series of blocks. For the coding to be optimal, it is necessary for the series to be fixed and known in advance. This means that, in order to allocate this mode to a given block in an optimum fashion, it would be necessary to know in advance all the blocks to which this code is allocated, and therefore to know the result of the allocation. There is therefore a difficulty in optimally allocating the coding modes to the blocks and consequently in obtaining the highest possible ratio of compression to distortion.

In the second aspect, the present invention aims to remedy the drawbacks of the prior art by providing a digital signal compression device and method which offers a high ratio of compression to distortion.

In the third aspect, the present invention aims to remedy the drawbacks of the prior art by providing a digital signal compression device and method which make it possible to allocate the trellis coded quantization coding mode to blocks formed in the signal, with great simplicity of implementation.

In a fourth aspect, the present invention aims to improve the first aspect of the invention, by applying a preprocessing between the step of breaking down into sub-bands and the coding step proper.

In the first aspect, the invention proposes a digital signal coding method, including the analysis of the signal in order to separate the pertinent information and the non-pertinent information, then the coding of the non-pertinent information according to a first coding mode which offers a high degree of compression, and coding of the pertinent information according to a second coding mode which limits distortion.

To this end, the invention proposes a digital signal coding method including a step of analysing the digital signal into a plurality of frequency sub-bands distributed in at least two different frequency bands, at least one first sub-band having a lower frequency and at least one second sub-band having a higher frequency, characterised in that it includes, for each second sub-band, the steps of:
dividing the second sub-band into blocks,
selecting first blocks which are to be coded by setting to a predetermined value and second blocks which are to be coded by trellis coded quantization, according to a selection criterion,
linking the second blocks selected at the previous step in order to form a series of blocks,
coding the series of blocks by trellis coded quantization of a series of coefficients extracted from the second blocks of the second sub-band.

Correlatively, the invention proposes a digital signal coding device including means of analysing the digital signal into a plurality of frequency sub-bands distributed in at least two different frequency bands, at least one first sub-band having a lower frequency and at least one second sub-band having a higher frequency, characterised in that it includes:
means of dividing each second sub-band into blocks,
means of selecting first blocks which are to be coded by setting to a predetermined value and second blocks which are to be coded by trellis coded quantization, according to a selection criterion,
means of linking the second blocks selected at the previous step in order to form a series of blocks,
means of coding the series of blocks by trellis coded quantization of a series of coefficients extracted from the second blocks of the second sub-band.

The breakdown into frequency sub-bands makes it possible to separate the pertinent information from the non-pertinent information. The non-pertinent information is then coded by setting to the predetermined value, which requires a nil transmission rate. Compression of the non-pertinent information is maximal.

It is thus possible to give a higher transmission rate to the pertinent information, present in the second blocks, which is thus coded more precisely. Distortion of the pertinent information is minimal, by virtue of the linking of the second blocks and their coding by trellis coded quantization.

Overall, the ratio of compression to distortion obtained is high.

The predetermined value is for example nil, so that, at decoding, blocks are constructed whose coefficients are nil.

According to a preferred characteristic, for each of the blocks the selection step includes the coding of the block by setting to the predetermined value and by a second coding mode, the comparison of the two coding modes according to the selection criterion and the selection of the coding by setting to the predetermined value if the block coded by setting to the predetermined value satisfies the selection criterion.

The selection is simple and rapid to implement. For example, the second coding mode is a scalar quantization of the coefficients of the block, or the second coding mode is a trellis coded quantization of a series of coefficients extracted from the blocks of the second sub-band. The latter case enables the structure of the coding device to be simplified, since the selection means then use the same coding as the means of coding the second blocks.

According to a preferred characteristic, the selection criterion minimises a weighted sum of the transmission rate and of the coding error caused by the coding of the block under consideration.

According to another preferred characteristic, an indicator is associated with each block in order to indicate whether or not the block under consideration is coded by setting to the predetermined value.

According to another preferred characteristic, the said at least one first sub-band is coded according to a third coding mode.

The coding device has means adapted to implement the above characteristics.

The invention also concerns a method of decoding a coded digital signal, the said signal including coded representations of blocks formed in frequency sub-bands of the original signal, each coded representation including at least one indicator representing a coding by setting to a predetermined value or a coding by trellis coded quantization of a series of coefficients extracted from blocks, characterised in that it includes the steps of:

reading the value of the indicator of each of the blocks, decoding representations by formation of reconstructed blocks, all the coefficients of which have the predetermined value, or by trellis coded dequantization of the series of coefficients, as a function of the value of the respective indicator of each of the blocks.

Correlatively, the invention concerns a device for decoding a coded digital signal, the said signal including coded representations of blocks formed in frequency sub-bands of the original signal, each coded representation including at least one indicator representing a coding by setting to a predetermined value or a coding by trellis coded quantization of a series of coefficients extracted from blocks, characterised in that it has:

means of reading the value of the indicator of each of the blocks, means of decoding representations by formation of reconstructed blocks, all the coefficients of which have the predetermined value, or by trellis coded dequantization of the series of coefficients, as a function of the value of the respective indicator of each of the blocks.

The decoding method and device make it possible to reconstruct the signal, for example in a receiving apparatus corresponding to a sending apparatus in which the signal has been coded according to the invention.

In the second aspect, the invention proposes an iterative optimisation of the allocation of coding by trellis coded quantization and of another coding mode, to blocks formed in a digital signal.

More precisely, the invention concerns a digital signal coding method, characterised in that it includes the steps of:

dividing the signal into blocks, updating, at which a coding cost for each of the blocks is calculated, for at least a first coding mode and for a coding mode by trellis coded quantization, allocating one of the coding modes to each of the blocks, according to an allocation criterion depending on the coding cost, reiterating the updating and allocation steps, so as to satisfy a convergence criterion.

Correlatively, the invention proposes a digital signal coding device, characterised in that it has:

means of dividing the digital signal into blocks, updating means, adapting to calculate a coding cost for each of the blocks, for at least a first coding mode and for a coding mode by trellis coded quantization, means of allocating one of the coding modes to each of the blocks, according to an allocation criterion depending on the coding cost, the updating and allocation means being adapted to be used iteratively, so as to satisfy a convergence criterion.

The method and device according to the invention make it possible to obtain a high ratio of compression to distortion. This is because, by virtue of the updating and allocation iterations, the invention improves the allocation of the coding modes to the blocks. The latter are thus coded in a more suitable fashion.

According to a preferred characteristic, the coding cost of each block is a weighted sum of the coding rate and error of the block under consideration. This coding cost is simple to implement and gives satisfactory results.

According to another preferred characteristic, at a given iteration, the calculation of the coding cost for the coding mode by trellis coded quantization of any block under consideration, to which the coding mode by trellis coded quantization has been allocated, includes the steps of:

linking the blocks to which the trellis coded quantization coding mode has been allocated, in order to form a series of blocks, coding the series of blocks by trellis coded quantization of a series of coefficients extracted from the linked blocks, extracting the coding rate and error from the block under consideration.

This calculation makes it possible to precisely determine the coding cost as defined.

According to a preferred characteristic, at a given iteration, the coding cost for the trellis coded quantization coding mode for any block under consideration, to which the first coding mode was allocated, is the coding cost for the trellis coded quantization coding mode for the block calculated at the time of the last iteration during which the trellis coded quantization coding mode was allocated to the block.

According to a preferred characteristic, the allocation criterion minimises the coding cost. Allocating a coding mode to a block amounts to comparing two coding costs and selecting the coding mode associated with the lowest cost.

According to a preferred characteristic, the coding method also includes an initialisation step at which the trellis coded quantization coding mode is allocated to each of the blocks. This step makes it possible to calculate a first trellis coded quantization coding cost for each of the blocks.

According to a preferred characteristic, the convergence criterion is satisfied when the same coding modes are respectively allocated to the same blocks at two successive iterations of the allocation step. This criterion is reliable whilst being simple to implement.

According to a preferred characteristic, an indicator is associated with each block in order to indicate which coding mode is allocated to each block. This indicator is then used at the time of decoding of the blocks.

According to a preferred characteristic, the first coding mode is a setting of the coefficients of the block to a predetermined value. This coding mode has the advantages of being a good approximation of the blocks containing little information, being very simple to implement and of having an associated coding rate which is nil.

The invention also concerns a method of decoding a coded digital signal, the said signal including coded representations of blocks formed in the original signal, each coded representation including at least one indicator representing either a first coding mode or a trellis coded quantization coding mode, characterised in that it includes the steps of:

reading the value of the indicator, decoding the coded representations, according to the value of the respective indicator.

Correlatively, the invention concerns a device for decoding a coded digital signal, the said signal including coded representations of blocks formed in the original signal, each coded representation including at least one indicator representing either a first coding mode or a trellis coded quantization coding mode, characterised in that it includes:

means of reading the value of the indicator, means of decoding the coded representations, according to the value of the respective indicator.

The decoding method and device enable the signal to be reconstructed, for example in a receiving apparatus corresponding to a sending apparatus in which the signal was coded according to the invention.

The invention also relates to a digital signal processing apparatus, having means of implementing the coding method, or the decoding method, or including the coding device, or the decoding device, as disclosed above.

The advantages of the coding device, of the decoding device and method and of this digital signal processing apparatus are identical to those of the coding method previously disclosed.

In the third aspect, the invention proposes an iterative optimisation of the allocation of coding by trellis coded quantization and of another coding mode, to blocks formed in a digital signal.

More precisely, the invention concerns a digital signal coding method, characterised in that it includes the steps of:

dividing the signal into blocks, updating, at which a coding cost for each of the blocks is calculated, for at least a first coding mode and for a coding mode by scalar quantization, allocating one of the coding modes to each of the blocks, according to an allocation criterion depending on the coding cost, reiterating the updating and allocation steps, so as to satisfy a convergence criterion, linking the blocks to which the scalar quantization coding mode was allocated, in order to form a series of blocks, coding the series of blocks by trellis coded quantization of a series of coefficients extracted from the blocks in the series.

Correlatively, the invention proposes a digital signal coding device, characterised in that it has:

means of dividing the digital signal into blocks, updating means, adapting to calculate a coding cost for each of the blocks, for at least a first coding mode and for a coding mode by scalar quantization, means of allocating one of the coding modes to each of the blocks, according to an allocation criterion depending on the coding cost, the updating and allocation means being adapted to be used iteratively, so as to satisfy a convergence criterion, means of linking the blocks to which the scalar quantization coding mode was allocated, in order to form a series of blocks, means of coding the series of blocks by trellis coded quantization of a series of coefficients extracted from the blocks in the series.

By virtue of the method and device according to the invention, the allocation of scalar quantization to the blocks constitutes a good approximation of the allocation of the trellis coded quantization coding mode and has the advantage of being simple and rapid to implement.

In addition, the method and device according to the invention make it possible to obtain a high ratio of compression to distortion. This is because, by virtue of the updating and allocation iterations, the invention improves the allocation of the coding modes to the blocks. The latter are thus coded in a more suitable fashion.

According to a preferred characteristic, the coding cost of each block is a weighted sum of the coding rate and error of the block under consideration. This coding cost is simple to implement and gives satisfactory results.

According to a preferred characteristic, at a given iteration, the calculation of the coding cost for the coding mode by scalar quantization of any block under consideration, includes the steps of:

grouping the blocks to which the scalar quantization coding mode has been allocated, in order to form a group of blocks, coding the group of blocks by scalar quantization, determining an entropic coder adapted to the distribution of the symbols resulting from the scalar quantization of the blocks of the group, entropic coding of the quantized block under consideration, by means of the previously determined entropic coder, extracting the coding rate of the block under consideration.

According to a preferred characteristic, at a given iteration, the calculation of the coding cost for the scalar quantization coding mode for any block under consideration includes the step of determining the distortion associated with the coding of the block under consideration by scalar quantization.

The coding rate and distortion for the scalar quantization coding mode are determined with calculations which are simple and rapid to make.

According to another preferred characteristic, the allocation criterion minimises the coding cost. Allocating a coding mode to a block amounts to comparing two coding costs and selecting the coding mode associated with the lowest cost.

According to a preferred characteristic, the method also includes an initialisation step at which the scalar quantization coding mode is allocated to each of the blocks. This step makes it possible to calculate a first scalar quantization coding cost for each of the blocks.

According to a preferred characteristic, the convergence criterion is satisfied when the same coding modes are respectively allocated to the same blocks at two successive iterations of the allocation step. This criterion is reliable whilst being simple to implement.

According to a preferred characteristic, an indicator is associated with each block in order to indicate which coding mode is allocated to each block. This indicator is then used at the time of decoding of the blocks.

According to a preferred characteristic, the first coding mode is a setting of the coefficients of the block to a predetermined value. This coding mode has the advantages of being a good approximation of the blocks containing little information, of being very simple to implement and of having an associated coding rate which is nil.

The invention also relates to a digital signal processing apparatus, having means of implementing the coding method, or including the coding device, as disclosed above.

The advantages of the coding device and of this digital signal processing apparatus are identical to those of the coding method previously disclosed.

In the fourth aspect, a preprocessing is applied between the step of breaking down into sub-bands and the coding step proper.

The invention proposes a digital signal coding method including the analysis of the signal in order to separate the pertinent information and the non-pertinent information, and then the preprocessing of the non-pertinent information according to a first preprocessing mode, and preprocessing of the pertinent information according to a second preprocessing mode. The preprocessing modes are determined so as to facilitate the coding of the preprocessed signal.

To this end, the invention proposes a digital signal coding method including a step of analysing the digital signal into a plurality of frequency sub-bands distributed in at least two different frequency bands, at least one first sub-band having a lower frequency and at least one second sub-band having a higher frequency, characterised in that it includes, for each second sub-band, the steps of:
  dividing the second sub-band into blocks,
  selecting first blocks and second blocks, according to a selection criterion,
  preprocessing the first blocks by applying a first preprocessing mode,
  preprocessing the second blocks by applying a second preprocessing mode,
  coding the sub-band including the preprocessed blocks, by applying a third coding mode.

Correlatively, the invention proposes a digital signal coding device including means of analysing the digital signal into a plurality of frequency sub-bands distributed in at least two different frequency bands, at least one first sub-band having a lower frequency and at least one second sub-band having a higher frequency, characterised in that it includes:
  means of dividing each second sub-band into blocks,
    means of selecting first blocks and second blocks, according to a selection criterion,
    means of preprocessing the first blocks by applying a first preprocessing mode,
    means of preprocessing the second blocks by applying a second preprocessing mode,
    means of coding the sub-band including the preprocessed blocks, by applying a third coding mode.

The method and device according to the invention afford a high ratio of compression to distortion.

This is because the selection separates the pertinent or useful information from the non-pertinent or parasitic information, such as background noise for example. The preprocessing then reduces the influence of the non-pertinent information, by virtue of which the coding is more effective.

Overall, the ratio of compression to distortion obtained is high.

According to a preferred characteristic, for each of the blocks, the selection step includes:
  the coding of the block by a first coding mode and by a second coding mode,
  the comparison of the two coding modes according to the selection criterion, and
  selecting the first and second blocks according to the result of the comparison.

The selection is simple to implement.

According to another preferred characteristic, the selection criterion minimises a weighted sum of the transmission rate and coding error caused by the coding of the block in question.

This criterion makes it possible to distinguish the blocks containing pertinent information and the blocks containing parasitic information.

According to preferred characteristics, the first coding mode is a setting to zero of the coefficients of the block, and the second coding mode is a scalar quantization of the coefficients of the block. The second coding mode can also be a coded trellis quantization of a series of coefficients extracted from the block, or a vector quantization of the block.

These coding modes are simple and rapid to implement.

According to other preferred characteristics, the first preprocessing mode is a zeroing of the coefficients of the block, and the second preprocessing mode is identity. Thus the parasitic information is replaced by zeroed blocks, whilst the pertinent information is not modified.

According to a preferred characteristic, the third coding mode is identical to the second coding mode, which simplifies the implementation of the invention.

According to preferred characteristics, the third coding mode is a trellis coded quantization of a series of coefficients extracted from the preprocessed blocks, or a scalar quantization of the sub-band, or also a vector quantization of the sub-band.

According to another preferred characteristic, the said at least one first sub-band is coded according to a fourth coding mode.

The coding device has means adapted to implement the above characteristics.

The invention also concerns an information storage means, which can be read by a computer or by a microprocessor, whether or not integrated into the device, optionally removable, and which stores a program implementing the coding or respectively decoding method.

The characteristics and advantages of the present invention will emerge more clearly from a reading of a preferred embodiment illustrated by the accompanying drawings, in which.

Figure 1:
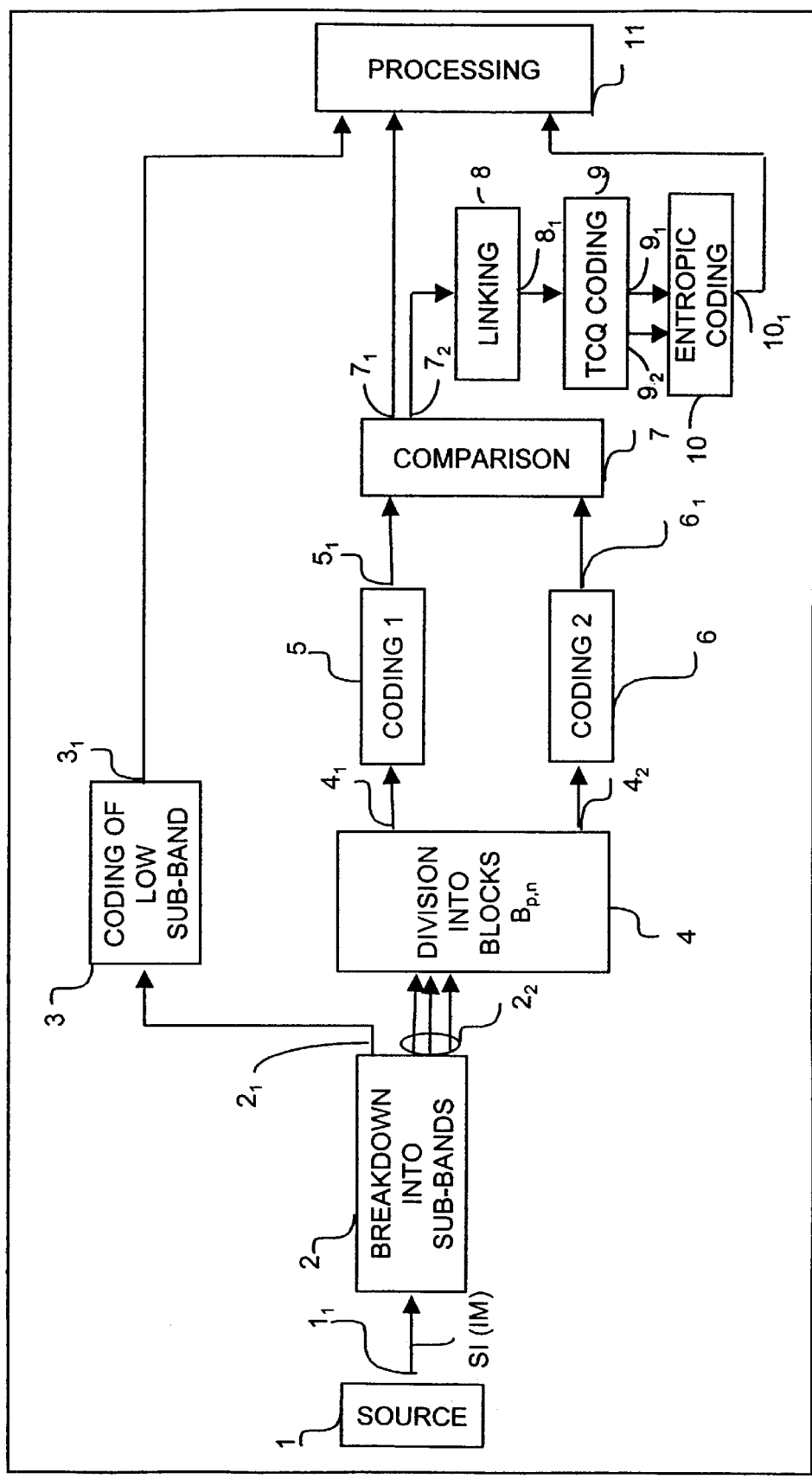
FIG. 1 depicts a block diagram of a first embodiment of a digital signal coding device according to the invention.

According to the first embodiment chosen and depicted in FIG. 1, a coding device according to the invention is designed to code a digital signal for the purpose of compressing it. The coding device is integrated into an apparatus 100, which is for example a digital photographic apparatus, or a digital camcorder, or a database management system, or again a computer.

The digital signal to be compressed SI is in this particular embodiment a series of digital samples representing an image.

The device has a signal source 1, here an image signal source. In general terms, the signal source either contains the digital signal, and is for example a memory, a hard disk or a CD-ROM, or converts an analogue signal into a digital signal, and is for example an analogue camcorder associated with an analogue to digital converter. An output $1_1$ of the signal source is connected to an analysis circuit or circuit for breaking down into sub-bands 2. The circuit 2 has a first output $2_1$ connected to a coding circuit 3.

Second outputs $2_2$ of the breakdown circuit 2 are connected to a circuit for dividing into blocks 4. The circuit 4 has first outputs $4_1$ connected to a first coding circuit 5 and second outputs $4_2$ connected to a second coding circuit 6.

An output $5_1$ of the circuit 5 and an output $6_1$ of the circuit 6 are connected to a comparison circuit 7, a first output $7_1$ of which is connected to a processing circuit 11 and a second output $7_2$ of which is connected to a connecting circuit 8. The latter has an output $8_1$ connected to a circuit 9 for encoding by trellis coded quantization, or TCQ.

The circuit 9 has outputs $9_1$ and $9_2$ connected to an entropic coding circuit 10, an output $10_1$ of which is connected to the processing circuit 11, which is for example a transmission circuit, or a memory. An output $3_1$ of the coding circuit 3 is also connected to the processing circuit 11.

The image source 1 is a device for generating a series of digital samples representing an image IM. The source 1 has an image memory and supplies a digital image signal SI to the input of the breakdown circuit 2. The image signal SI is a series of digital words, for example bytes. Each byte value represents a pixel of the image IM, here with 256 grey levels, or black and white image.

The circuit for breaking down into sub-bands 2, or analysis circuit, is, in this embodiment, a conventional set of filters, respectively associated with decimators by two, which filter the image signal in two directions, into sub-bands of high and low spatial frequencies. According to FIG. 2, the circuit 2 here has three successive analysis units for breaking down the image IM into sub-bands according to three resolution levels. It should be noted that the invention does not necessarily imply a breakdown according to several resolution levels, but only a breakdown of the signal to be coded into several sub-bands.

In general terms, the resolution of a signal is the number of samples per unit length used to represent this signal. In the case of an image signal, the resolution of a sub-band is related to the number of samples per unit length for representing this sub-band horizontally and vertically. The resolution depends on the number of decimations performed, on the decimation factor and on the resolution of the initial image.

The first analysis unit receives the digital image signal and applies it to two digital filters, respectively low pass and high pass 21 and 22, which filter the image signal in a first direction, for example horizontal in the case of an image signal. After passing through decimators by two 210 and 220, the resulting filtered signals are respectively applied to two low-pass filters 23 and 25, and high pass filters 24 and 26, which filter them in a second direction, for example vertical in the case of an image signal. Each resulting filtered signal passes through a respective decimator by two 230, 240, 250 and 260. The first unit delivers at its output four sub-bands $LL_1$, $LH_1$, $HL_1$ and $HH_1$ of the highest resolution $RES_1$ in the breakdown.

The sub-band $LL_1$ includes the components, or coefficients, of low frequency in both directions, of the image signal. The sub-band $LH_1$ includes the components of low frequency in a first direction and of high frequency in a second direction, of the image signal. The sub-band $HL_1$ includes the components of high frequency in the first direction and the components of low frequency in the second direction. Finally, the sub-band $HH_1$ includes the components of high frequency in both directions.

Each sub-band is a set of real coefficients constructed from the original image, which contains information corresponding to a respectively vertical, horizontal and diagonal orientation of the contours of the image, in a given frequency band. Each sub-band can be assimilated to an image.

The sub-band $LL_1$ is analysed by an analysis unit similar to the previous one in order to supply four sub-bands $LL_2$, $LH_2$, $HL_2$ and $HH_2$ with a resolution level $RES_2$ which is intermediate in the breakdown. The sub-band $LL_2$ includes the components of low frequency in both analysis directions, and is in its turn analysed by the third analysis unit similar to the previous two. The third analysis unit supplies sub-bands $LL_3$, $LH_3$, $HL_3$ and $HH_3$, with the lowest resolution $RES_3$ in the breakdown, resulting from the division of the sub-band $LL_2$ into sub-bands.

Each of the sub-bands of resolution $RES_2$ and $RES_3$ also corresponds to an orientation in the image.

The breakdown performed by the circuit 2 is such that a sub-band of given resolution is divided into four sub-bands of lower resolution and therefore has four times more coefficients than each of the sub-bands of lower resolution.

Figure 4:
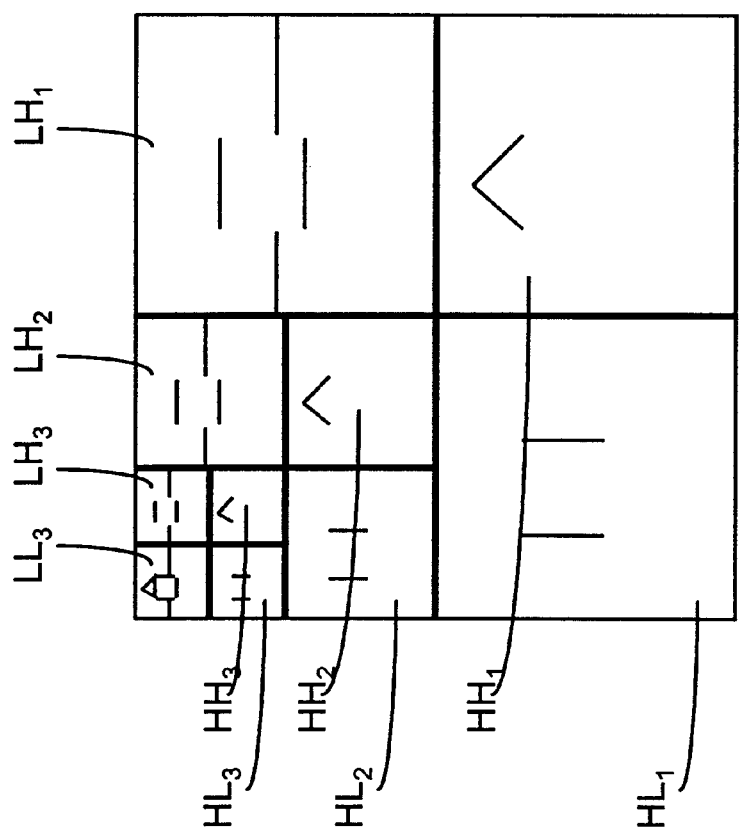
FIG. 4 depicts an image broken down into sub-bands by the circuit of FIG. 2.
Figure 3:
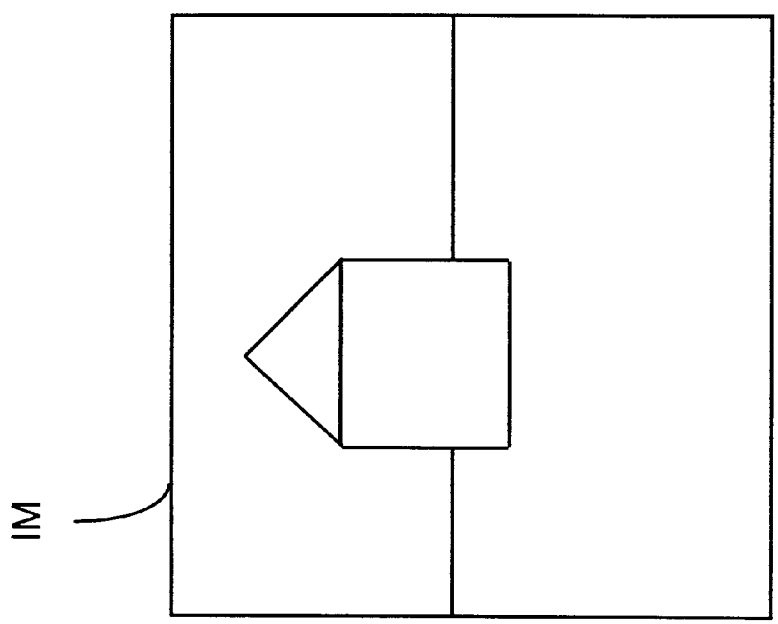
FIG. 3 depicts a digital image to be coded by the coding device of FIG. 1.

A digital image IM output from the image source 1 is depicted schematically in FIG. 3, whilst FIG. 4 depicts the image IMD resulting from the breakdown of the image IM, into ten sub-bands according to three resolution levels, by the circuit 2. The image IMD contains as much information as the original image IM, but the information is divided by frequency according to three resolution levels.

The level of lowest resolution $RES_3$ includes the sub-bands $LL_3$, $HL_3$, $LH_3$ and $HH_3$, that is to say the sub-bands of low frequency according to the two analysis directions. The second resolution level $RES_2$ includes the sub-bands $HL_2$, $LH_2$ and $HH_2$ and the level of highest resolution $RES_1$ includes the sub-bands of highest frequency $HL_1$, $LH_1$ and $HH_1$.

The sub-band $LL_3$ of lowest frequency is a reduction of the original image. The other sub-bands are detail sub-bands.

Naturally, the number of resolution levels, and consequently of sub-bands, can be chosen differently, for example 13 sub-bands and four resolution levels, for a bi-dimensional signal such as an image. The number of sub-bands per resolution level can also be different. The analysis and synthesis circuits are adapted to the dimension of the processed signal.

The sub-band $LL_3$ of lowest resolution $RES_3$ is applied to the coding circuit 3, which codes it into a coded, or compressed, sub-band $LLc_3$.

The coding circuit 3 performs a DPCM (Differential Pulse Code Modulation) coding, which is a coding by linear prediction, with loss. Each pixel of the sub-band to be coded $LL_3$ is predicted according to its neighbours, and this prediction is subtracted from the value of the pixel under consideration, for the purpose of forming a differential "image" which has less correlation between pixels than the original image. The differential image is then quantized and coded by a Huffman coding in order to form the coded sub-band $LLc_3$.

According to other embodiments, the coding circuit 3 performs a coding by discrete cosine transformation (DCT), or by vector quantization, or again by fractal coding, or by any other fixed-image coding method. In all cases, the coding of the low sub-band must exhibit a good coding quality, since the low sub-band must be coded with the greatest possible precision in order to obtain good restoration of the image on decoding.

In all cases, the sub-band of lowest frequency is preferentially processed separately. This is because this sub-band contains a large quantity of information, and it is preferable to code it with the greatest possible precision, without setting blocks zero. However, in order to simplify the implementation, it is possible to code the lowest-frequency sub-band like the detail sub-bands.

The sub-bands $LH_3$, $HL_3$ and $HH_3$, as well as the higher-resolution sub-bands $HL_2$, $LH_2$, $HH_2$, $HL_1$, $LH_1$ and $HH_1$ are supplied to the division circuit 4, in a sub-band order which is a priori arbitrary, but predetermined.

Figure 5:
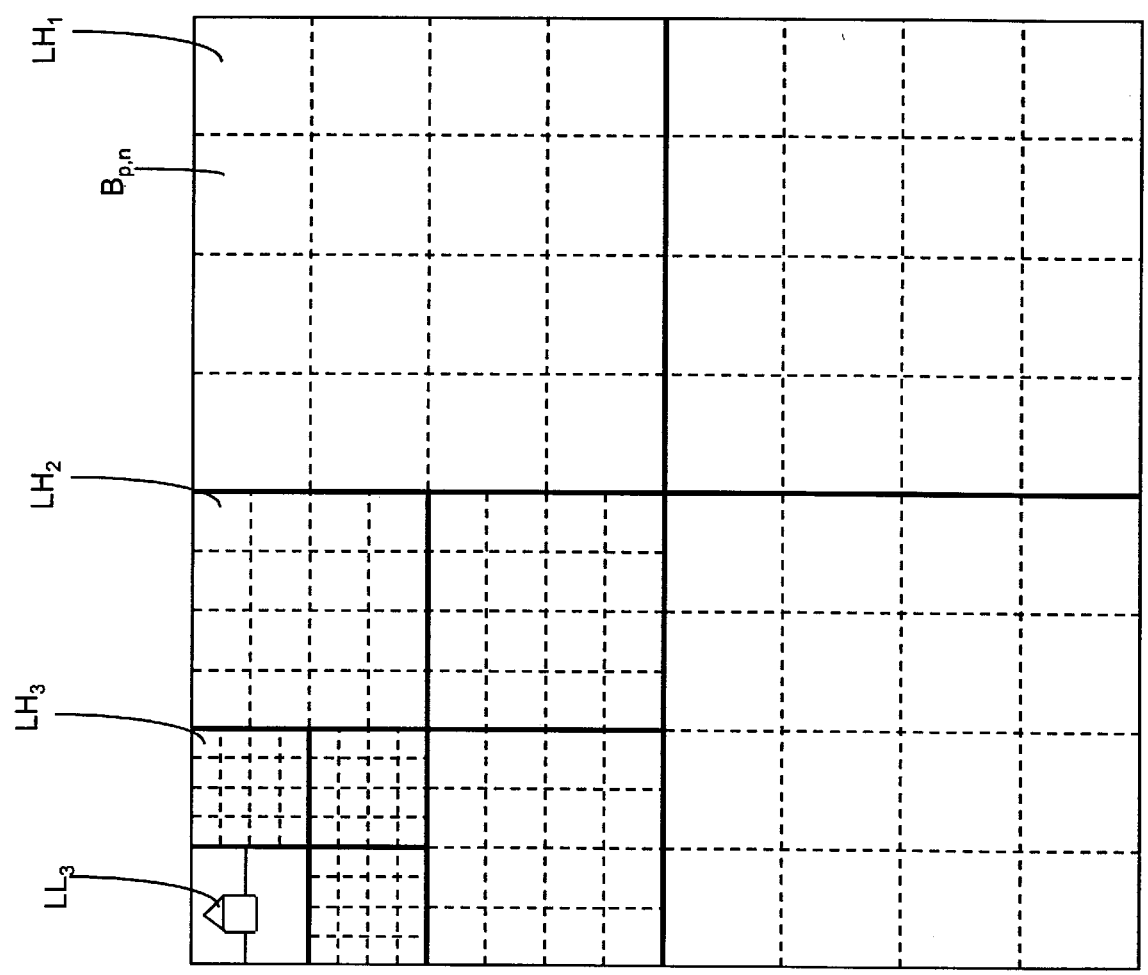
FIG. 5 depicts an image broken down into sub-bands and then divided into blocks.

As depicted in FIG. 5, the division circuit 4 divides each detail sub-band into blocks. According to the embodiment chosen, all the sub-bands supplied to the circuit 4 are divided into the same number N of blocks $B_{p,n}$, where the index p is an integer, here between 1 and 9, which represents the order of the sub-band in question, and the index n, between 1 and N, is an integer which represents the order of the block in the sub-band in question. The blocks are here square in shape, but can in a variant be rectangular in shape. In general terms, a block is a set of coefficients extracted from the sub-band in order to form a vector.

The order of the blocks is a priori arbitrary, but predetermined. For practical reasons, the blocks are ordered in the same way in all the sub-bands, for example from left to right and from top to bottom.

In consequence of the mode of dividing into blocks, the surface of the blocks is divided by four, passing from the resolution $RES_1$ to the resolution $RES_2$, and from the resolution $RES_2$ to the resolution $RES_3$.

This division is simple to implement, since all the sub-bands are divided into the same number of blocks. However, for implementing the invention, the number and format of the blocks can be different from one resolution to another.

The coding circuit 5 codes each block $B_{p,n}$ supplied by the circuit 4 according to the first coding mode. This mode consists of setting all the coefficients of the block to a predetermined value, for example the value zero. This coding is very economical in numbers of bits, since it entails the transmission or storage of no coding data, and consequently requires a nil transmission rate. However, the coding error may be great if the block under consideration is not of low energy.

The coding circuit 6 codes each block $B_{p,n}$ supplied by the circuit 4 by means of a second coding mode, here by uniform scalar quantization of each of the coefficients of the block and then coding of the indices resulting from the quantization by means of a Huffman coding.

As a variant, the blocks can be coded according to another coding method, for example by vector quantization, or by trellis coded quantization, which will be described hereinafter. The coding method used must be able to code with precision a block containing a large quantity of information.

For each of the blocks, the circuit 7 compares the two codings according to a criterion for selecting the most appropriate coding, according to this criterion, for each block considered. To this end, the circuit 7 determines the rates $R_{1,p,n}$ and $R_{2,p,n}$ necessary for transmitting the block coded by each of the two circuits 5 and 6, as well as the coding errors, or distortion, $D_{1,p,n}$ and $D_{2,p,n}$ caused by the coding performed by each of the two circuits 5 and 6. The errors $D_{1,p,n}$ and $D_{2,p,n}$ here measure respectively the quadratic error imparted to the image reconstructed by the coding of the block in question, according to the first and second coding modes. Where the breakdown into sub-bands is orthogonal, the errors $D_{1,p,n}$ and $D_{2,p,n}$ are equal to the quadratic errors between the original block and the reconstructed block.

The circuit 7 next compares, for each of the blocks, the sums $R_{1,p,n} + \lambda . D_{1,p,n}$ and $R_{2,p,n} + \lambda . D_{2,p,n}$, where $\lambda$ is a coefficient for setting the compression/distortion ratio. The coding for which the sum is the lowest is selected, for each of the blocks under consideration.

An indicator $I_{p,n}$ is associated with each of the blocks in order to indicate which is the coding selected by the circuit 7. The indicator $I_{p,n}$ is for example a bit which is set to zero if the block in question is coded by setting to zero, and which is set to one otherwise. The indicator $I_{p,n}$ forms part of the coded form of the block under consideration.

The circuits 5, 6 and 7 thus effect a separation of the pertinent information and the non-pertinent information. The non-pertinent information, that is to say the blocks to be coded by setting to zero, have their indicator $I_{p,n}$ as the coded form. The pertinent information, that is to say the other blocks, will then be coded by the circuits 8, 9 and 10.

The circuit 7 transmits to the connecting circuit 8 the indicator $I_{p,n}$ of each coded block. The connecting circuit 8 takes into account the blocks which are not coded by setting to zero and links the blocks so as to form a series of blocks $\{B_m\}$, m being an integer between one and M and M being the number of blocks in the series. To form the series, the blocks are for example considered from left to right and from top to bottom, in each frequency band, the frequency bands themselves being considered from left to right and from top to bottom. The circuit 8 supplies this series to the coding circuit 9.

Figure 6:
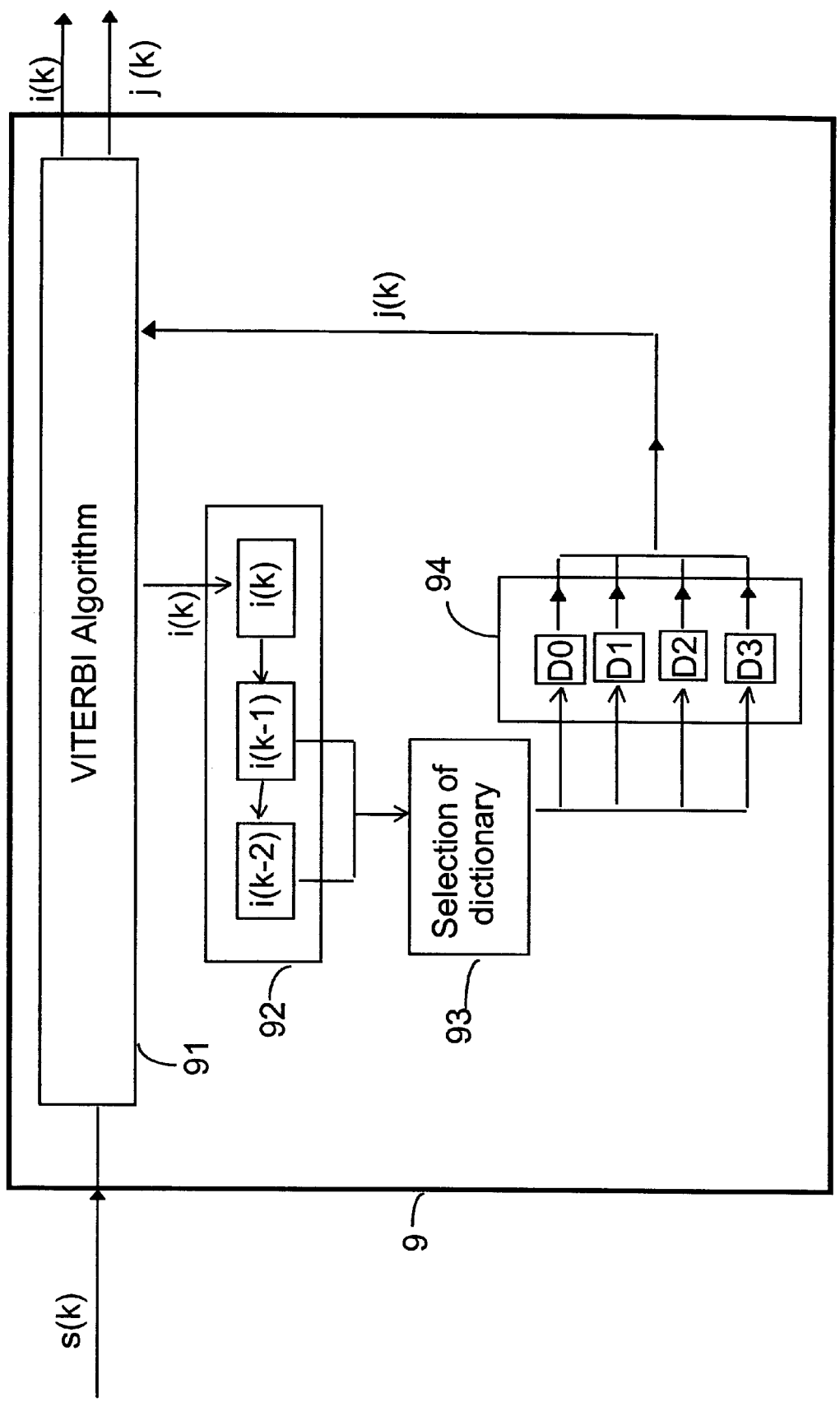
FIG. 6 depicts a circuit for coding by trellis coded quantization, included in the device of FIG. 1.

With reference to FIG. 6, the circuit 9 is a circuit for coding by trellis coded quantization, or TCQ. The circuit 9 includes a circuit 91 for coding according to the Viterby algorithm, a shift register 92, a dictionary selection circuit 93 and memory means 94 for storing code vector dictionaries.

Coding by trellis coded quantization is described for example in the article entitled "Trellis Coded Quantization of Memoryless and Gauss-Markov Sources" by M. W. Marcellin and T. R. Fischer, which appeared in IEEE Transactions on Communications, Vol 38, Number 1, January 1990, as well as in the article "Universal Trellis Coded Quantization" by J. H. Kasner, M. W. Marcellin and B. R. Hunt, available by Internet at the address http://vail.ece.arizona.edu/Publications.html.

In general terms, the coding circuit 9 codes a series of symbols $\{s_k\}$ in order to supply two binary flows i(k) and j(k), where i(k) represents a series of transitions and j(k) represents a series of indices of the code vector dictionaries.

In the context of the invention, the symbols $s_k$ are the coefficients extracted from the blocks $B_m$, possibly quantized, supplied by the circuit 8.

The functioning of the circuit 9 is that of a finite-state machine, passage from one state to another being identified by a transition. In a first embodiment, each state corresponds to a dictionary and is identified by the two binary values i(k−2) and i(k−1).

Each of the dictionaries contains code vectors which are each identified by an index in the dictionary concerned. A code vector is consequently completely identified by its index and by the state representing the dictionary to which it belongs.

The possible transitions of the finite-state machine, for the series of symbols to be coded, form a regular structure, or trellis. The circuit 91 uses a Viterby algorithm to determine an optimum path in the trellis, that is to say a dictionary for each of the symbols $s_k$ of the series to be coded.

The path is optimal in the sense of a cost which is minimised over the entire trellis, and therefore over the entire series to be coded. The cost of a transition is the quadratic error measured between the symbol to be coded and the code vector selected in the dictionary identified by the state in which the transition ends up. The cost of a state of the trellis is the sum of the costs of the transition leading to this state. The Viterby algorithm calculates the minimum cost of each state in order to determine the optimum path represented by the series of transitions i(k).

In a second embodiment, the number of states is greater than the number of dictionaries. For example, four dictionaries and eight states are used. The shift register then stores three binary values in order to define the eight states. Each state is associated with two dictionaries.

In all cases, the circuit 9 supplies the two binary flows i(k) and j(k) to the entropic coding circuit 10, which combines them and performs an entropic coding.

The circuit 11 thus receives the coded low sub-band, the indices of the blocks of the detail sub-bands which are coded by setting to zero, and the series of indices and transitions resulting from the trellis coded quantization.

Figure 7:
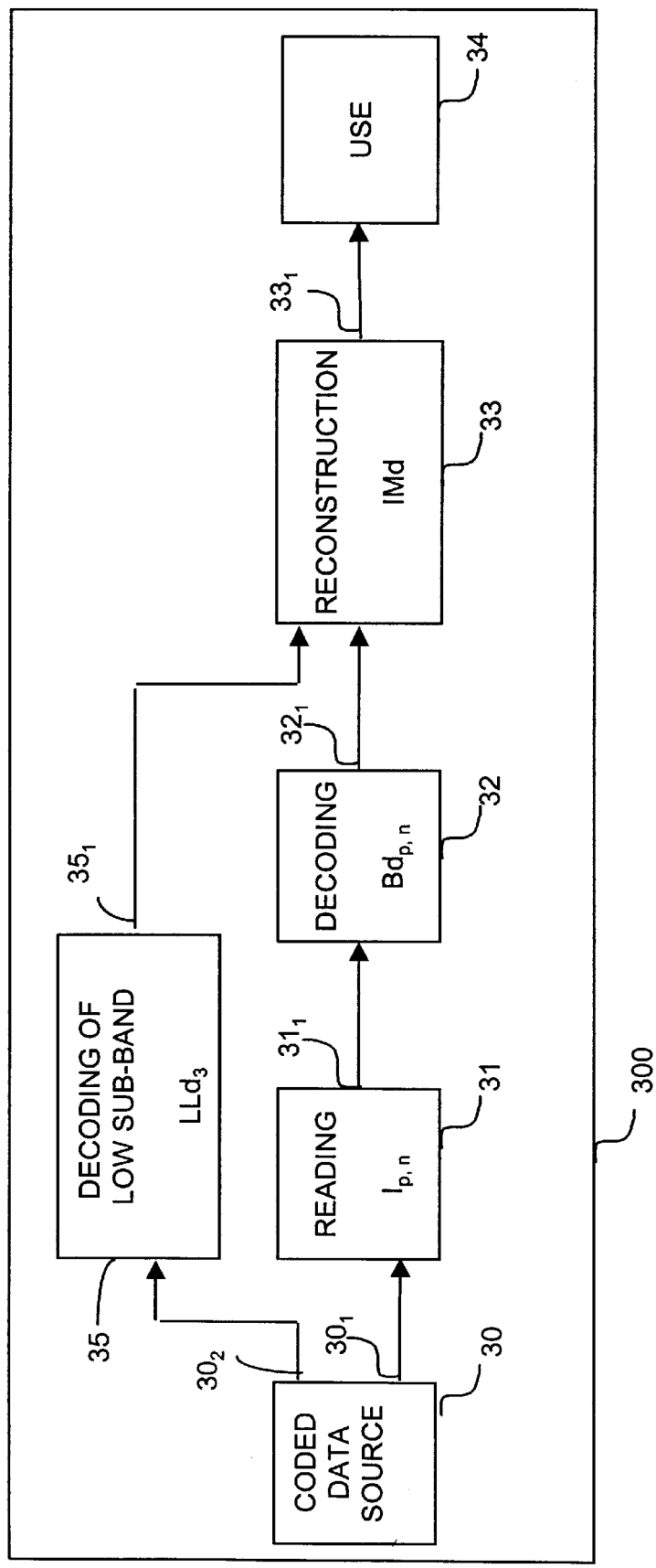
FIG. 7 depicts a block diagram of a first embodiment of a decoding device according to the invention.

With reference to FIG. 7, the decoding device according to the first embodiment of the invention performs operations overall which are the inverse of those of the coding device. The decoding device is integrated into an apparatus 300, which is for example a digital image reader, or a digital video sequence reader, or a database management system, or again a computer.

One and the same apparatus may include both the coding device and the decoding device according to the invention, so as to perform coding and decoding operations.

The decoding device has a coded data source 30 which includes for example a receiving circuit associated with a buffer memory.

A first output $30_1$ of the circuit 30 is connected to a circuit 31 of the indicator reader $I_{p,n}$, an output $31_1$ of which is connected to a decoding circuit 32.

The decoding circuit 32 has an output $32_1$ connected to a reconstruction circuit 33. The latter has an output $33_1$ connected to a circuit 34 for using the decoded data, including for example image display means.

The circuit 30 supplies coded data to the circuit 31, which determines the coding mode used for each of the blocks by analysing the indicator $l_{p,n}$.

If the indicator $I_{p,n}$ indicates that the block under consideration is coded by setting to zero, its decoding consists of creating a block, all the coefficients of which are at the value zero. The size of the block created depends on the sub-band currently being decoded.

If the indicator $I_{p,n}$ indicates that the block under consideration is coded by trellis coded quantization, the circuit 32 performs overall operations which are the inverse of those performed at coding. For each symbol to be decoded, the transition i(k) is read in order to determine a code vector dictionary, and the index j(k) is read to determine a code vector in this dictionary. The set of decoded symbols forms a decoded block.

The circuit 32 supplies the decoded blocks $Bd_{p,n}$ to the reconstruction circuit 33, which is a synthesis circuit corresponding to the analysis circuit 2 described previously, and reconstructs the image IMd corresponding to the decoded sub-bands.

A second output $30_2$ of the circuit 30 is connected to a circuit 35 for decoding the sub-band of lowest frequency, a first output $35_1$ of which is connected to the reconstruction circuit 33.

The decoding circuit 35 performs operations which are the inverse of those of the coding circuit 3, and supplies the decoded sub-band $LLd_3$ to the reconstruction circuit 33.

According to a preferred embodiment of the invention, the circuits for breaking down into sub-bands 2, for coding 3, for dividing into blocks 4, for coding 5 and 6, for comparison 7, for connection 8, for coding 9 and 10 and for processing 11, all included in the coding device depicted in FIG. 1, are implemented by means of a microprocessor associated with random access and read-only memories. The read-only memory contains a program for coding each of the blocks of data, and the random access memory contains registers adapted to record variables modified during the running of the program.

The coding program can be stored wholly or partly in any information storage means capable of cooperating with the microprocessor. This storage means can be read by a computer or by a microprocessor. This storage means is or is not integrated into the device, and can be removable. For example it may include a magnetic tape, a diskette or a CD-ROM (fixed-memory compact disc).

Likewise, the circuits for reading 31, decoding 32 and 35 and reconstruction 33, included in the decoding device depicted in FIG. 7, are produced by means of a second microprocessor associated with random access and read-only memories. The read-only memory contains a program for decoding each of the blocks of data, and the random access memory contains registers adapted to record variables modified during the running of the program.

The decoding program can be stored wholly or partly in any information storage means capable of cooperating with the microprocessor. This storage means can be read by a computer or by a microprocessor. This storage means is or is not integrated into the device, and can be removable.

For example it may include a magnetic tape, a diskette or a CD-ROM (fixed-memory compact disc).

Figure 8:
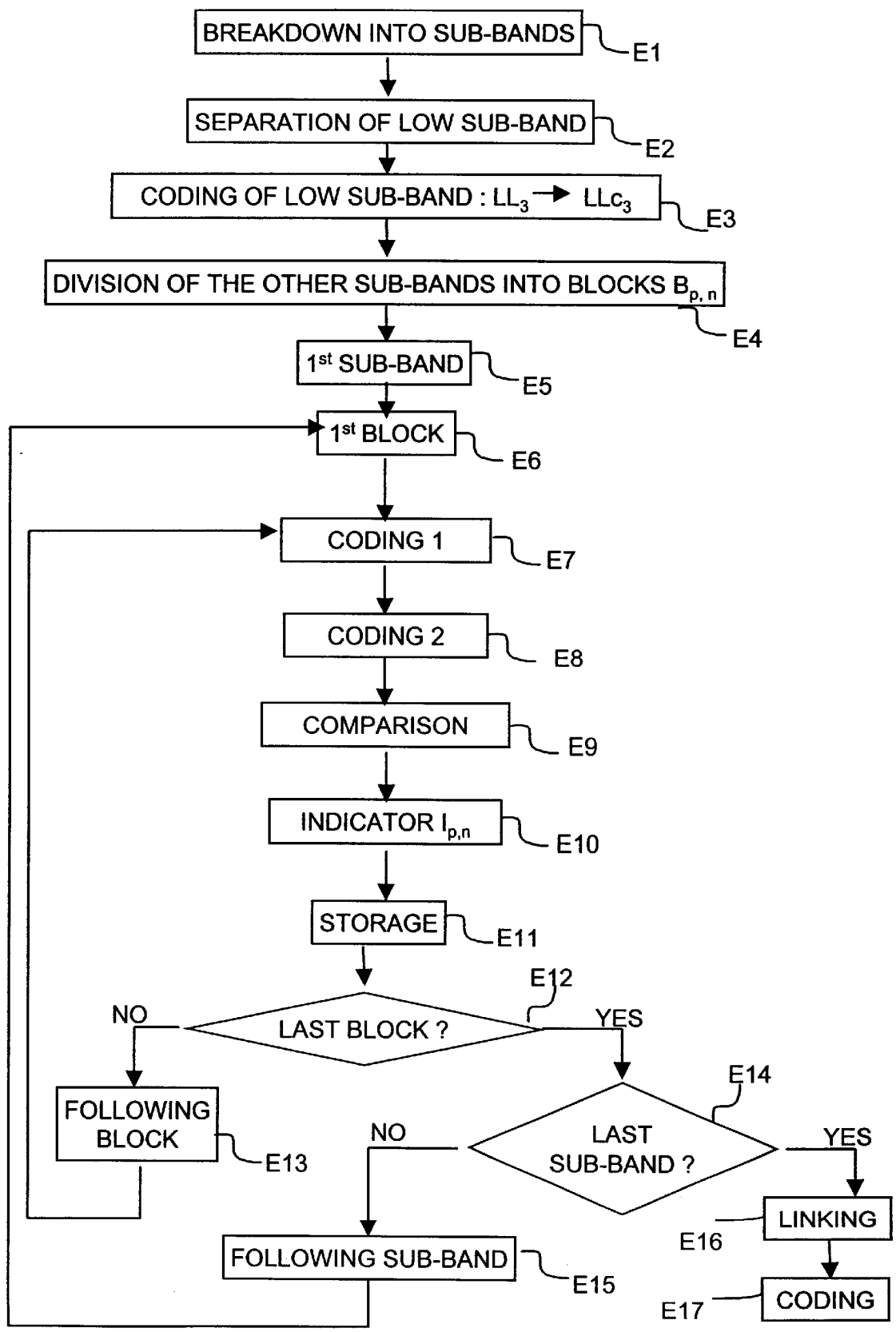
FIG. 8 depicts an algorithm for coding a digital signal according to the first embodiment of the invention.

With reference to FIG. 8, a method according to the first embodiment of the invention for coding an image IM, implemented in the coding device, includes steps E1 to E17.

Step E1 is the breakdown of the image IM into sub-bands, as depicted in FIG. 4. Step E1 results in the sub-bands $LL_3$, $HL_3$, $LH_3$ and $HH_3$ of lowest resolution $RES_3$, the sub-bands $LH_2$, $HL_2$, $HH_2$ of intermediate resolution $RES_2$, and the sub-bands $LH_1$, $HL_1$ and $HH_1$ of highest resolution $RES_1$.

The sub-band $LL_3$ is separated from the other sub-bands at the following step E2.

The step E3 codes the sub-band $LL_3$ according to a DPCM (Differential Pulse Code Modulation) coding, and results in the coded sub-band $LLc_3$, which is stored and/or transmitted.

The step E3 is followed by the step E4, which is the division of the other sub-bands into blocks $B_{p,n}$, as depicted in FIG. 5.

The following step E5 is an initialisation for considering the first sub-bands. The sub-bands are taken into account in an order which is a priori arbitrary, whilst being predetermined.

The following step E6 is an initialisation for considering the first block of the current sub-band. The blocks of the current sub-band are taken into account in an arbitrary and predetermined order.

The step E6 is followed by the step E7, which is the coding by setting to a predetermined value, here zero, of the coefficients of the current block $B_{p,n}$. The following step E8 is the coding, by a second coding mode, here scalar quantization, of the current block $B_{p,n}$. The second coding mode can be a plurality of coding modes.

The following step E9 is the comparison of the two coding modes, for the current block, according to a predetermined criterion. The step E9 determines whether the current block $B_{p,n}$ is to be coded by setting to zero or by trellis coded quantization.

To this end, the sums $R_{1,p,n}+\lambda.D_{1,p,n}$ and $R_{2,p,n}+\lambda.D_{2,p,n}$ are calculated, where $R_{1,p,n}$ and $R_{2,p,n}$ are the rates necessary for transmitting the current block coded by the two modes, $D_{1,p,n}$ and $D_{2,p,n}$ are the distortions caused in the current block by the two coding modes, and $\lambda$ is a coefficient for setting the compression/distortion ratio. As disclosed above, the errors $D_{1,p,n}$ and $D_{2,p,n}$ measure respectively the quadratic error imparted to the image reconstructed by the coding of the block in question, according to the first and second coding modes. The coding for which the sum is the lowest is selected, for the current block.

At the following step E10, an indicator $I_{p,n}$ is associated with the current block in order to indicate which is the coding selected at step E9. The indicator $I_{p,n}$ is for example a bit which is set to zero if the block in question is coded by setting to zero, and which is set to one if the block under consideration is coded by trellis coded quantization.

The following step E11 is the storage of the value of the indicator $I_{p,n}$.

The steps E12 and E14 are tests for verifying whether respectively all the blocks of a sub-band and all the sub-bands have been coded. If there remains at least one block to be coded in the current sub-band, the step E12 is followed by the step E13 in order to consider the following block. The step E13 is followed by the previously described step E7.

If there remains at least one sub-band to be coded, the step E14 is followed by the step E15 in order to consider the following sub-band. The step E15 is followed by the previously described step E6.

When all the sub-bands have been processed, a determination has been made as to which coding mode is allocated to each of the blocks, the step E14 is followed by the step E16, at which the blocks which are not to be coded by setting to zero are linked. The blocks are for example considered from left to right and from top to bottom, in each frequency band, the frequency bands themselves being considered from left to right and from top to bottom. The step E16 results in a series of blocks to be coded $\{B_m\}$. As a variant, the step E16 is performed before the step E14, that is to say a series is formed for each sub-band, each series then being processed independently of the other series.

The following step E17 is the coding by trellis coded quantization of the series of blocks to be coded. The coding is performed as previously disclosed (FIG. 6) and can be followed by an entropic coding of the binary series obtained.

The coding of the image thus results in a low sub-band coded separately, blocks coded by setting to zero and blocks linked and then coded by trellis coded quantization. The coded image can be transmitted and/or stored to memory.

Figure 9:
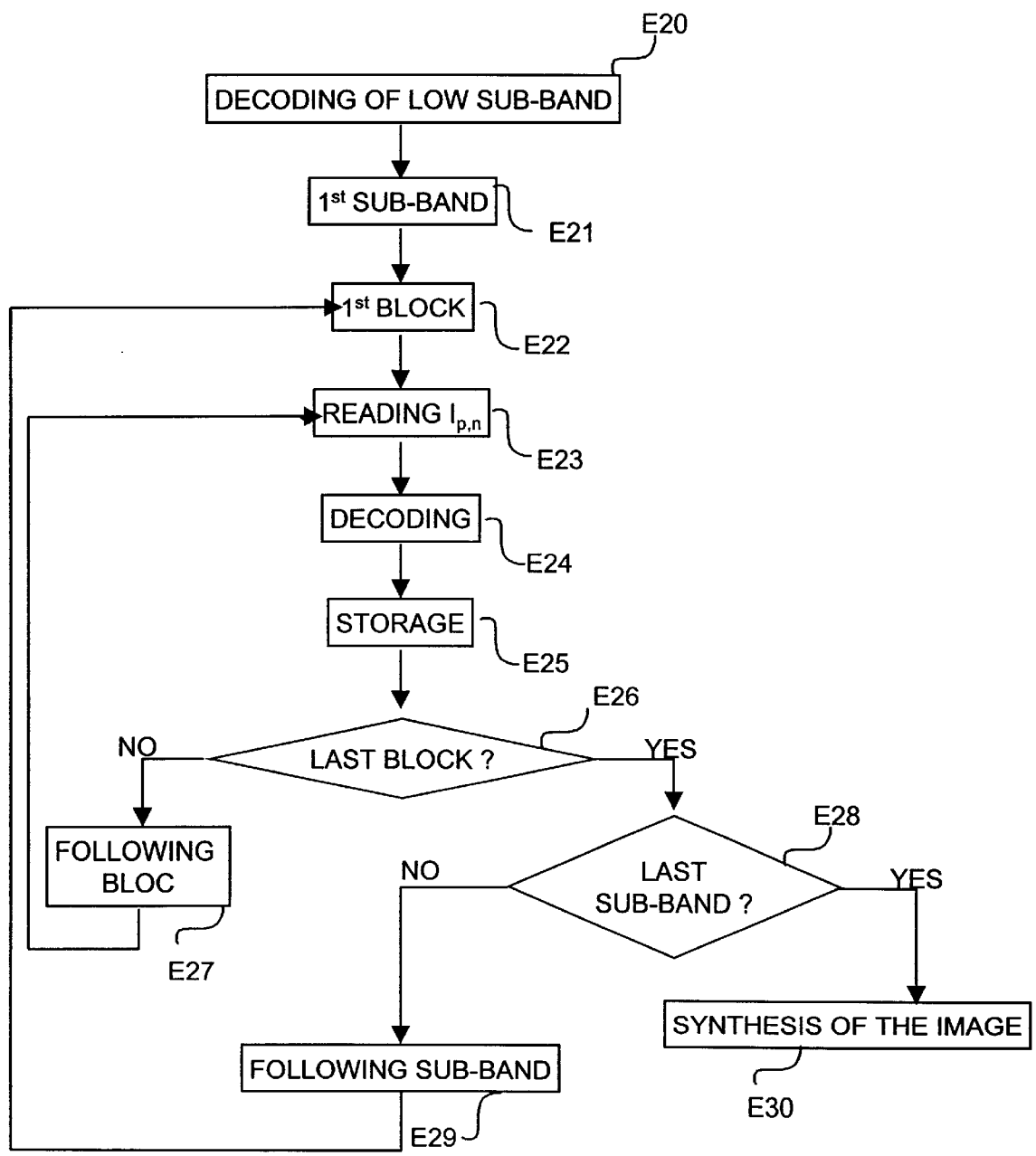
FIG. 9 depicts an algorithm for decoding a digital signal according to the first embodiment of the invention.

With reference to FIG. 9, a method according to the first embodiment of the invention for decoding an image IM, implemented in the decoding device, comprises steps E20 to E30.

The step E20 is the decoding of the low sub-band $LLc_3$ in order to form a decoded low sub-band $LLd_3$, which is stored to memory.

The following step E21 is an initialisation for considering the first detail sub-band to be decoded.

The step E21 is followed by the step E22, which is an initialisation for considering the first block to be decoded in the current sub-band. The sub-bands are decoded in a predetermined order, for example the same order as at coding, and the blocks in a given sub-band are decoded in a predetermined order, for example the same order as at coding, although different orders are possible.

The following step E23 is the reading of the indicator $I_{p,n}$ in order to determine which coding mode was used for coding the current block.

The step E23 is followed the step E24, which is the decoding of the current block. If the block has been coded by setting to zero, the decoding consists of creating a block, all the coefficients of which are at the value zero. The size of the block created depends on the sub-band currently being decoded, and is for example determined by the index of the block. If the block has been coded by trellis coded quantization, operations which are the inverse of those performed at coding are performed. The coding data of the block under consideration are extracted from the series of indices and transitions. For each symbol to be decoded, the transition i(k) is read in order to determine a code vector dictionary, and the index j(k) is read in order to determine a code vector in this dictionary. The set of symbols decoded forms a decoded block.

The decoded block $Bd_{p,n}$ is stored at the following step E25.

The steps E26 and E28 are steps for verifying whether respectively all the blocks of a sub-band and all the sub-bands have been decoded. If there remains at least one block to be decoded in the current sub-band, the step E26 is followed by the step E27 in order to consider the following block. The step E27 is followed by the previously described step E23.

If there remains at least one sub-band to be decoded, the step E28 is followed by the step E29 in order to consider the following sub-band. The step E29 is followed by the previously described step E22.

When all the sub-bands have been decoded, that is to say when the response is positive at step E28, the latter step is followed by the step E30 of constructing the decoded image. The latter can then be displayed, for example.

As a variant, all the blocks coded by setting to zero are decoded on the one hand, and all the blocks coded by trellis coded quantization are decoded on the other hand.

Figure 10:
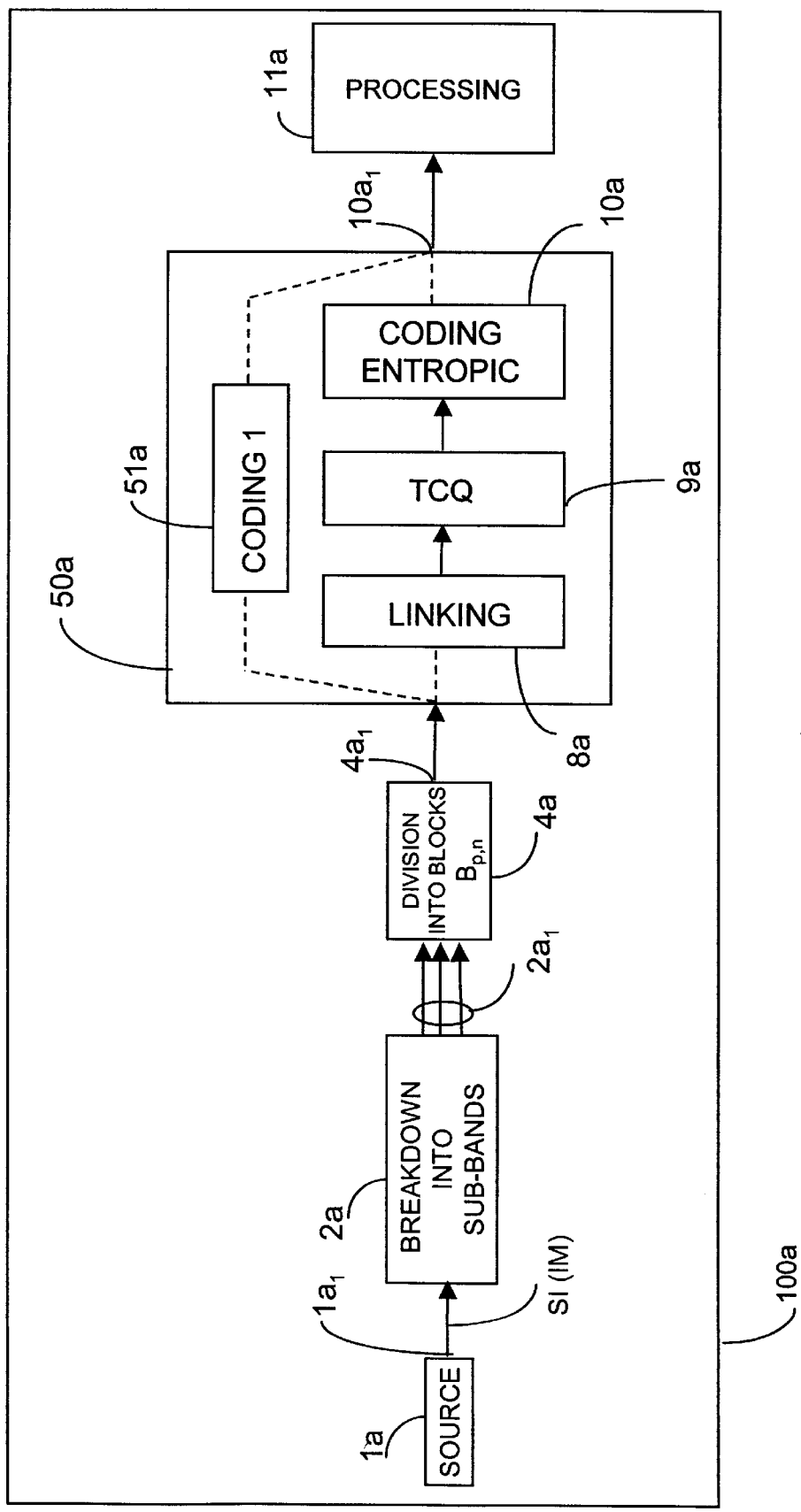
FIG. 10 is a block diagram of a second embodiment of a digital signal coding device according to the invention.

According to the second embodiment chosen and depicted in FIG. 10, a coding device according to the invention is designed to code a digital signal for the purpose of compressing it. The coding device is integrated into an apparatus 100a, which is for example a digital photographic apparatus, or a digital camcorder, or a database management system, or again a computer.

The digital signal to be compressed SI is in this particular embodiment a series of digital samples representing an image.

The device has a signal source 1a which is similar to the source 1 (FIG. 1). An output $1a_1$ of the signal source is connected to a first analysis circuit or circuit for breaking down into sub-bands 2a. The breakdown circuit 2a has outputs $2a_1$ connected to a circuit for dividing into blocks 4a. The circuit 4a has outputs $4a_1$ connected to a coding circuit 50a.

The coding circuit 50a includes several coding circuits, for example first and second circuits 51a and 9a, which code the blocks received from the circuit 4a according to first and second coding modes. The first coding mode is here a setting of the coefficients of the blocks to a predetermined value, and the second coding mode is a trellis coded quantization of a series of symbols extracted from the blocks, referred to as TCQ, standing for "Trellis Coded Quantization". The trellis coded quantization is preceded by a linking of the blocks to be coded, this linking being performed by a linking circuit 8a connected to the input of the coding circuit 9a. An entropic coding circuit 10a is connected to the output of the coding circuit 9a.

An output $10a_1$ of the circuit 50a is connected to a processing circuit 11a, which is for example a transmission circuit or a memory.

Figure 2:
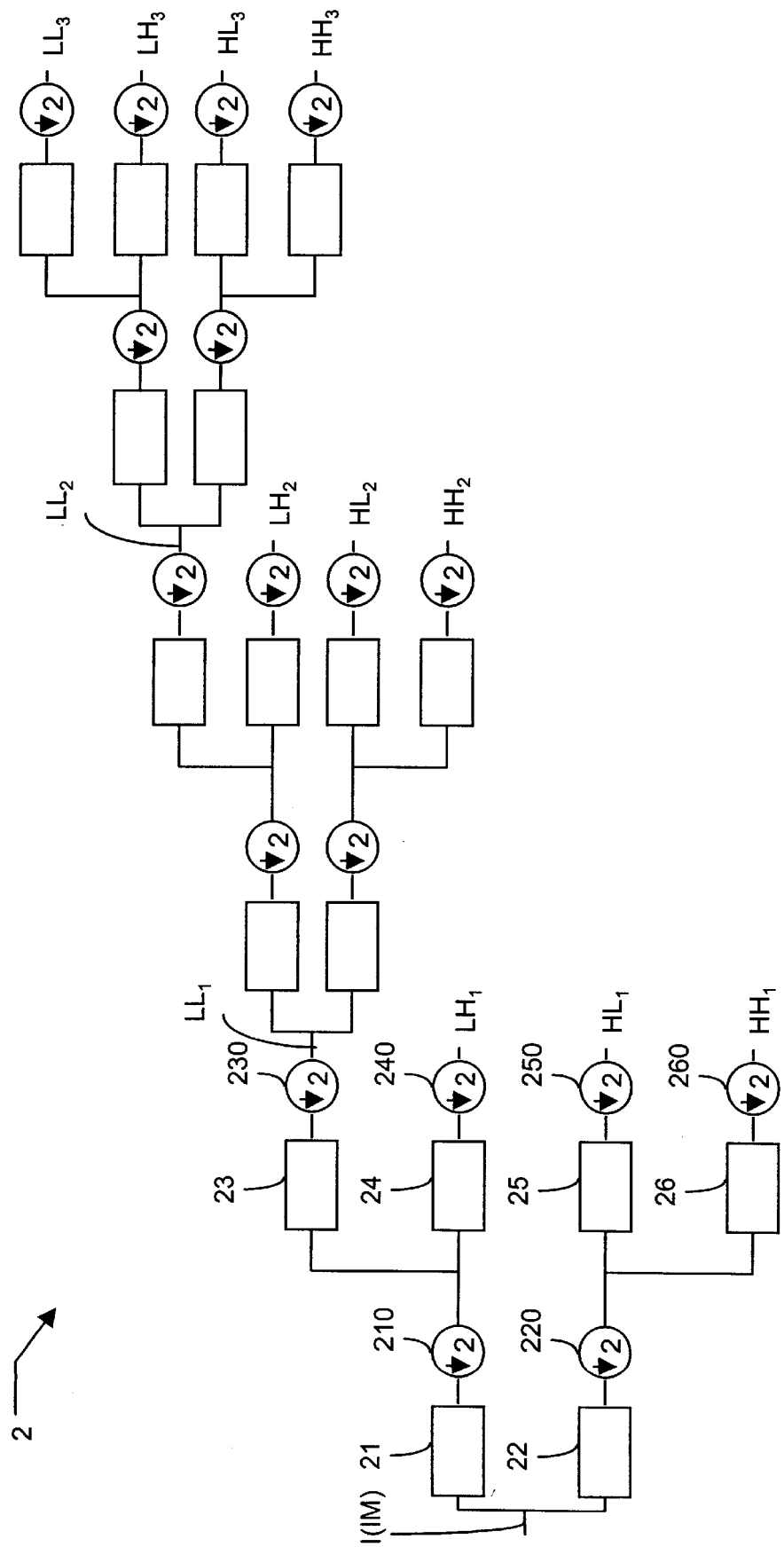
FIG. 2 depicts a circuit for breaking down into frequency sub-bands, included in the device of FIG. 1.

The circuits 2a, 4a, 8a, 9a and 10a are respectively similar to the circuits 2, 4, 8, 9 and 10 previously described (FIG. 2).

Figure 12:
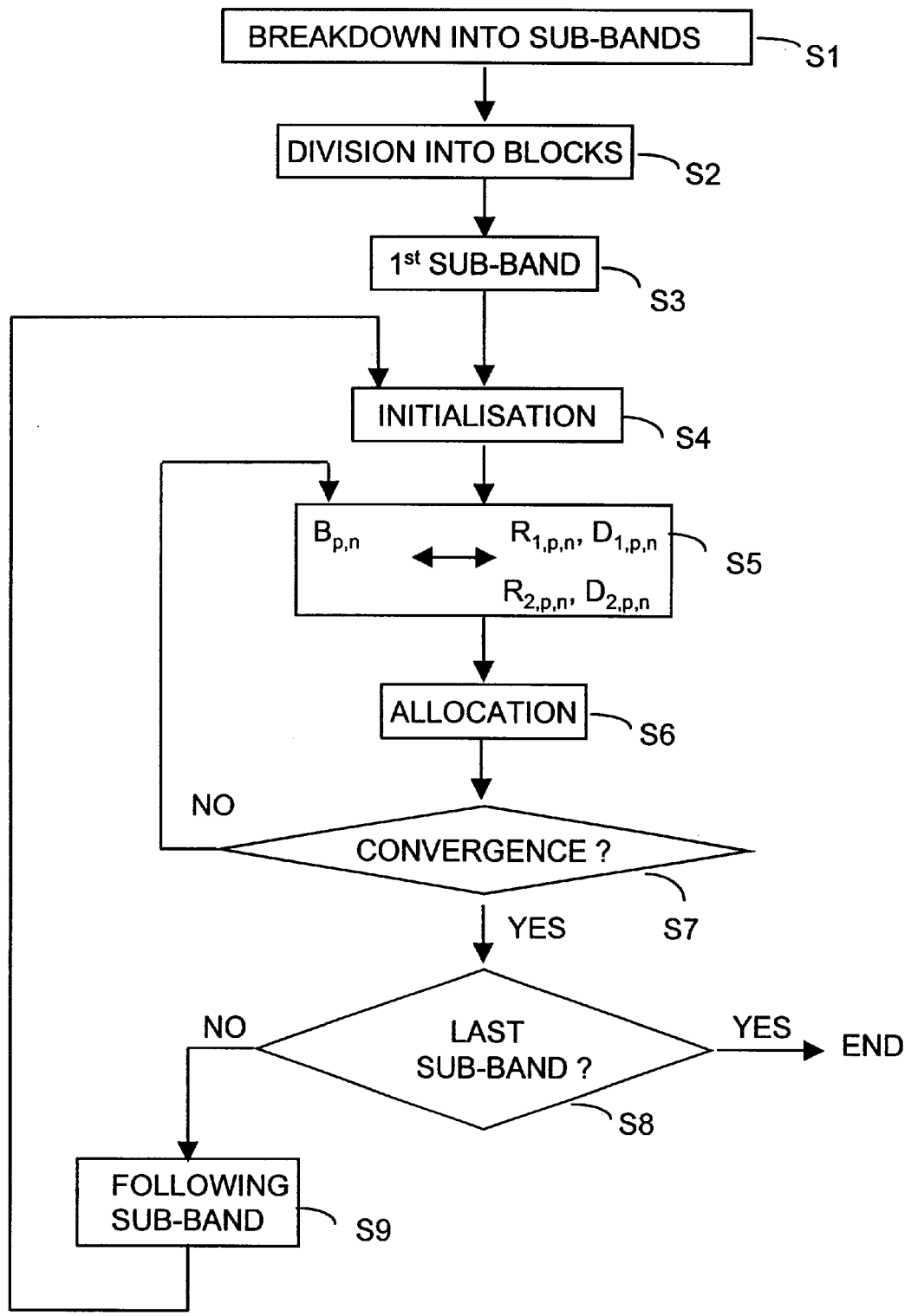
FIG. 12 is a digital signal coding algorithm according to the second embodiment of the invention.

An indicator $I_{p,n}$ is associated with each of the blocks in order to indicate which coding mode is selected by the circuit 50a. The indicator $I_{p,n}$ is for example a word whose value represents the coding selected. The selection of the coding mode is made by iteration and is detailed below (FIG. 12).

The circuit 50a transmits to the processing circuit 8 the indicators $I_{p,n}$ of each of the coded blocks, associated with the coded sequence of blocks.

Figure 11:
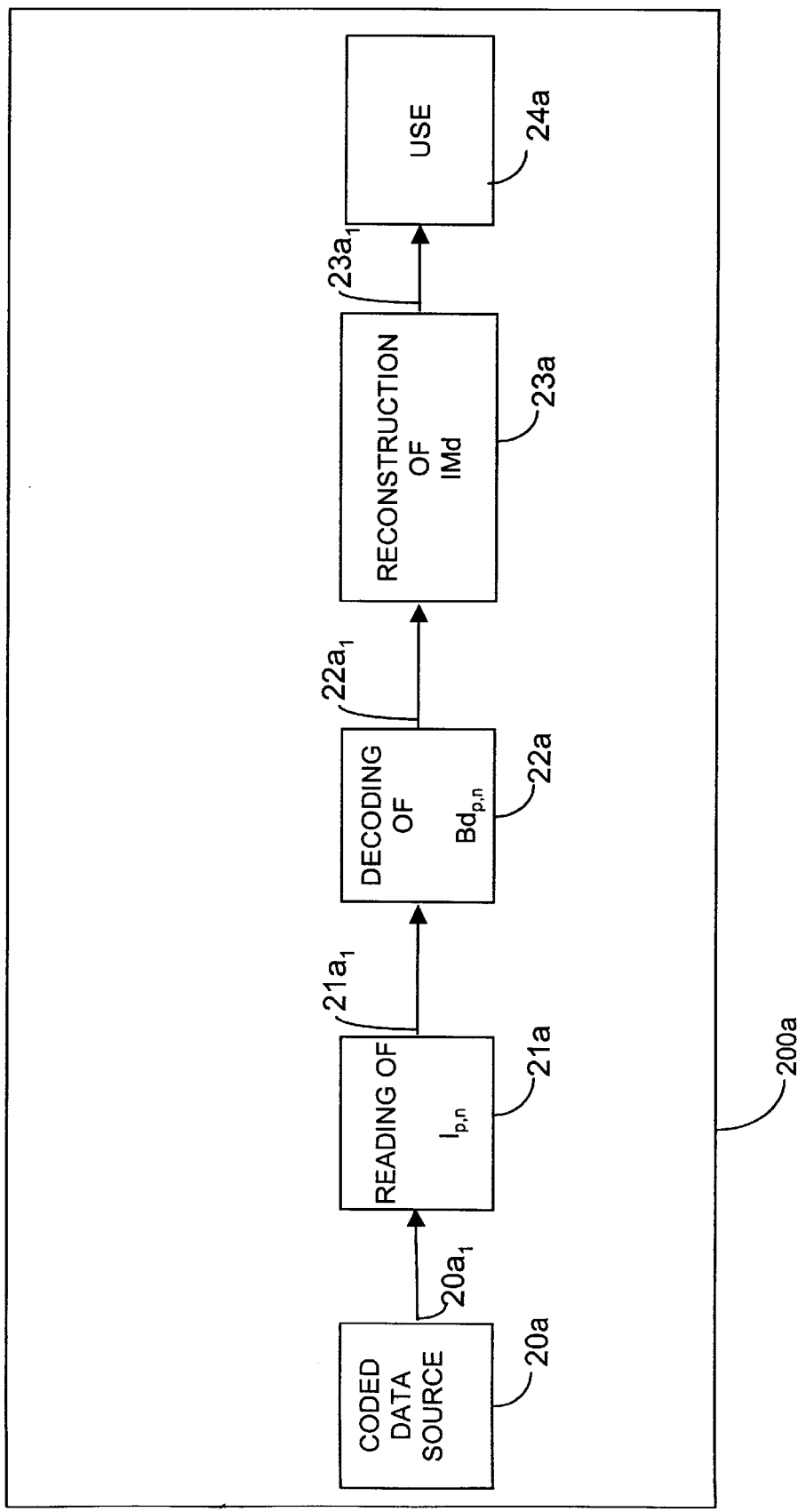
FIG. 11 is a block diagram of a second embodiment of a decoding device according to the invention.

With reference to FIG. 11, the decoding device according to the second embodiment of the invention performs operations overall which are the inverse of those of the coding device. The decoding device is integrated into an apparatus 200a, which is for example a digital image reader, or a digital video sequence reader, or a database management system, or again a computer.

One and the same apparatus may include both the coding device and the decoding device according to the invention, so as to perform coding and decoding operations.

The decoding device has a coded data source 20a which includes for example a receiving circuit associated with a buffer memory.

An output $20a_1$ of the circuit 20a is connected to a circuit 21a for reading an indicator $I_{p,n}$, an output $21a_1$ of which is connected to a decoding circuit 22a.

The decoding circuit 22a has an output $22a_1$ connected to a reconstruction circuit 23a. The latter has an output $23a_1$ connected to a circuit 24a for using the decoded data, including for example image display means.

The circuit 20a supplies coded data to the circuit 21a, which determines the coding mode used for each of the blocks by analysing the indicator $I_{p,n}$.

If the indicator $I_{p,n}$ indicates that the block under consideration is coded by setting to zero, its decoding consists of creating a block, all the coefficients of which are at the value zero. The size of the block created depends on the sub-band currently being decoded.

If the indicator $I_{p,n}$ indicates that the block under consideration is coded by trellis coded quantization, the circuit 22a performs overall operations which are the inverse of those performed at coding. For each symbol to be decoded, the transition i(k) is decoded in order to determine a code vector dictionary, and the index j(k) is decoded to determine a code vector in this dictionary. The set of decoded symbols forms a decoded block.

The circuit 22a supplies the decoded blocks $Bd_{p,n}$ to the reconstruction circuit 23a, which is a synthesis circuit corresponding to the analysis circuit 2a described previously, and reconstructs the image IMd corresponding to the decoded sub-bands.

According to a preferred embodiment of the invention, the circuits for breaking down into sub-bands 2a, for dividing into blocks 4a, for coding 50a and for processing 11a, all included in the coding device depicted in FIG. 10, are implemented by means of a microprocessor associated with random access and read-only memories. The read-only memory contains a program according to the invention for coding each of the blocks of data, and the random access memory contains registers adapted to record variables modified during the running of the program.

The coding program can be stored wholly or partly in any information storage means capable of cooperating with the microprocessor. This storage means can be read by a computer or by a microprocessor. This storage means is or is not integrated into the device, and can be removable. For example it may include a magnetic tape, a diskette or a CD-ROM (fixed-memory compact disc).

Likewise, the reading 21a, decoding 22a and reconstruction 23a circuits included in the decoding device depicted in FIG. 11 are implemented by a second microprocessor associated with random access and read only memories. The read only memory contains a program according to the invention for decoding each of the blocks of data, and the random access memory contains registers adapted to record variables modified during the running of the program.

The decoding program can be stored wholly or partly in any information storage means capable of cooperating with the microprocessor. This storage means can be read by a computer or by a microprocessor. This storage means is or is not integrated into the device, and can be removable. For example it may include a magnetic tape, a diskette or a CD-ROM (fixed-memory compact disc).

With reference to FIG. 12, a method according to the second embodiment of the invention of coding an image IM, implemented in the coding device, includes steps S1 to S9. The coding method uses two coding modes which can be allocated to the blocks according to a criterion.

Step S1 is the breakdown of the image IM into sub-bands, as shown in FIG. 4. Step E1 results in the sub-bands $LL_3$, $HL_3$ $HL_3$ and $HH_3$ with the lowest resolution $RES_3$, the sub-bands $LH_2$, $HL_2$, $HH_2$ of intermediate resolution $RES_2$, and the sub-bands $LH_1$, $HL_1$ and $HH_1$ with the highest resolution $RES_1$. As disclosed above, the breakdown into sub-bands is not essential for the invention.

Step S1 is followed by step S2, which is the division of the sub-bands into blocks $B_{p,n}$, as shown in FIG. 5.

The following step S3 is an initialisation for considering the first sub-band. The sub-bands are taken into account in an order which is in principle random, whilst being predetermined. Each sub-band is processed independently of the other sub-bands.

The following step S4 is an initialisation at which the indicator $I_{p,n}$ of each of the blocks $B_{p,n}$ of the current sub-band is set to a value indicating that the block is coded by the second coding mode, namely by trellis coded quantization.

Step S4 is followed by step S5, which is the updating of the rates and distortions, for each of the blocks in the sub-band under consideration.

At this step, the following are calculated and stored:

the rate $R_{1,p,n}$ associated with the coding of the block $B_{p,n}$ by setting to zero, the distortion $D_{1,p,n}$ associated with the coding of the block $B_{p,n}$ by setting to zero, the rate $R_{2,p,n}$ associated with the coding of the block $B_{p,n}$ by trellis coded quantization, and the distortion $D_{2,p,n}$ associated with coding of the block $B_{p,n}$ by trellis coded quantization.

The rate $R_{1,p,n}$ associated with the coding of the block $B_{p,n}$ by setting to zero is nil. The distortion $D_{1,p,n}$ associated with the coding of the block $B_{p,n}$ by setting to zero is equal to the quadratic error of the block. These two quantities are calculated only once, when step S5 is first passed through. This is because these quantities do not vary during the subsequent coding iterations.

In order to determine the rate $R_{2,p,n}$ and distortion $D_{2,p,n}$ associated with the coding of the block $B_{p,n}$ by trellis coded quantization, it is necessary to consider two cases.

In the first case, the indicator $I_{p,n}$ of the block $B_{p,n}$ indicates that the block is to be coded by trellis coded quantization.

The blocks which are to be coded by trellis coded quantization are linked so as to form a series of blocks to be coded $\{B_m\}$. The blocks are for example considered from left to right and from top to bottom, in the frequency band. The block $B_{p,n}$ then forms part of the series of blocks to be coded by trellis coded quantization. The coding of the series of blocks is performed as previously disclosed (FIG. 6). At the first iteration, all the blocks in the sub-band under consideration form part of the series to be coded by trellis coded quantization.

The coding rate of the block $B_{p,n}$ is determined. For this purpose, the entropy of the coded series is determined and the contribution of the block under consideration is extracted. The coding distortion of the block $B_{p,n}$ is determined with respect to the original block.

The error $D_{2,p,n}$ measures the quadratic error induced in the reconstructed image by the coding of the block under consideration. Where the breakdown into sub-bands is orthogonal, the error $D_{2,p,n}$ is equal to the quadratic error between the original block and the reconstructed block.

In the second case, the indicator $I_{p,n}$ of the block $B_{p,n}$ indicates that the block is to be coded by the first coding mode, that is to say by setting to zero. It does not form part of the series of blocks to be coded by trellis coded quantization. The coding rate and distortion by the second coding mode (trellis coded quantization) are estimated by means of their respective value determined and stored during the last iteration during which the block under consideration was in a series of blocks to be coded by trellis coded quantization.

The following step S6 is the allocation, for each of the blocks in the sub-band in the course of processing, of the coding mode which is the most suited to it, according to a criterion. The criterion consists of minimising a coding cost, which is in general terms a function of the rate and distortion.

According to a preferred embodiment, the coding cost is the sum $R_{j,p,n}+\lambda.D_{j,p,n}$, where $\lambda$ is a coefficient for adjusting the compression/distortion ratio, and j is an integer equal to 1 or 2, representing the first or second coding mode.

The coefficient $\lambda$ varies from zero to infinity. For practical reasons, the sum $(1-\lambda).D_{j,p,n}+\lambda.D_{j,p,n}$, can be used in an equivalent fashion, with the coefficient $\lambda$ varying between zero and one.

The coding mode which minimises the sum $R_{j,p,n}+\lambda.D_{j,p,n}$ is selected for coding the block under consideration $B_{p,n}$ Consequently the value of the indicator $I_{p,n}$ of the block under consideration is updated.

The following step S7 is a convergence test. This test consists of checking whether the same coding modes are allocated to the same blocks, in the course of several, for example, two, successive repetitions of steps S5 and S6.

As long as the convergence test is not satisfied, step S7 is followed by step S5. When the convergence test is satisfied, step S7 is followed by step S8.

As a variant, a maximum number of repetitions of steps S5 and S6 is predetermined, so as to limit the duration of coding.

The result of coding the sub-band under consideration is a set of indicators indicating, for each block, which coding mode was allocated to it after convergence, and the series of data coded by trellis coded quantization.

The following step S8 is a test for determining whether all the sub-bands have been processed. If there remains at least one sub-band to be processed, step S8 is followed by step S9 in order to consider the following sub-band. Step S9 is followed by the previously described step S4.

Figure 13:
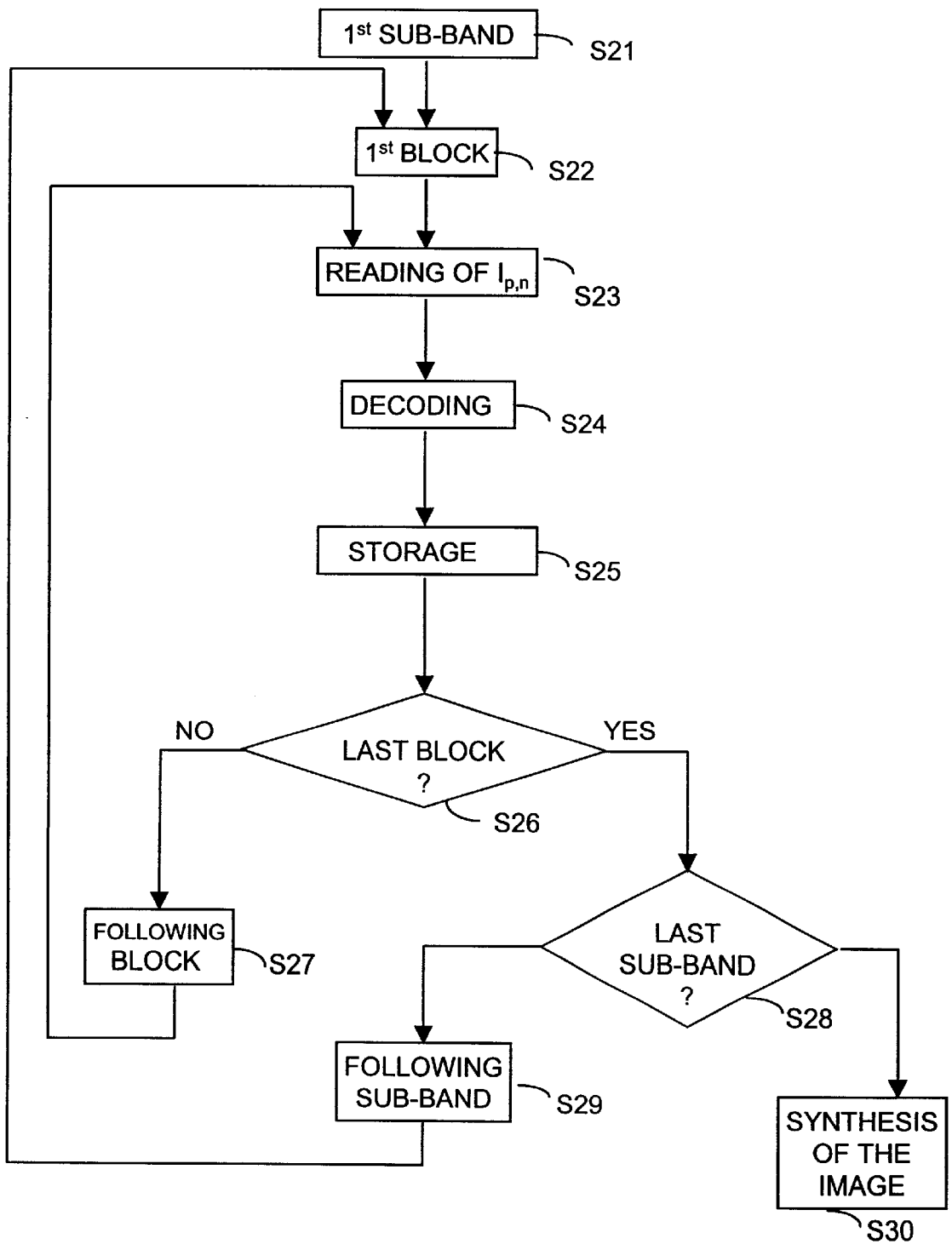
FIG. 13 is a digital signal decoding algorithm according to the second embodiment of the invention.

With reference to FIG. 13, a method according to the second embodiment of the invention for decoding an image IM, implemented in the decoding device, comprises steps S21 to S30.

The step S21 is an initialisation for considering the first sub-band to be decoded.

The step S21 is followed by the step S22, which is an initialisation for considering the first block to be decoded in the current sub-band. The sub-bands are decoded in the same order as at coding, and the blocks in a given sub-band are decoded in the same order as at coding, although different orders are possible.

The following step S23 is the reading of the indicator $I_{p,n}$ in order to determine which coding mode was used for coding the current block.

The step S23 is followed the step S24, which is the decoding of the current block. If the block has been coded by setting to zero, the decoding consists of creating a block, all the coefficients of which are at the value zero. The size of the block created depends on the sub-band currently being decoded, and is for example determined by the index of the block. If the block has been coded by trellis coded quantization, operations which are the inverse of those performed at coding are performed. The coding data of the block under consideration are extracted from the series of indices and transitions. For each symbol to be decoded, the transition i(k) is decoded in order to determine a code vector dictionary, and the index j(k) is decoded in order to determine a code vector in this dictionary. The set of symbols decoded forms a decoded block.

The decoded block $Bd_{p,n}$ is stored at the following step S25.

The steps S26 and S28 are steps for verifying whether respectively all the blocks of a sub-band and all the sub-bands have been decoded. If there remains at least one block to be decoded in the current sub-band, the step S26 is followed by the step S27 in order to consider the following block. The step S27 is followed by the previously described step S23.

If there remains at least one sub-band to be decoded, the step S28 is followed by the step S29 in order to consider the following sub-band. The step S29 is followed by the previously described step S22.

When all the sub-bands have been decoded, that is to say when the response is positive at step S28, the latter step is followed by the step S30 of constructing the decoded image. The latter can then be displayed, for example.

Figure 14:
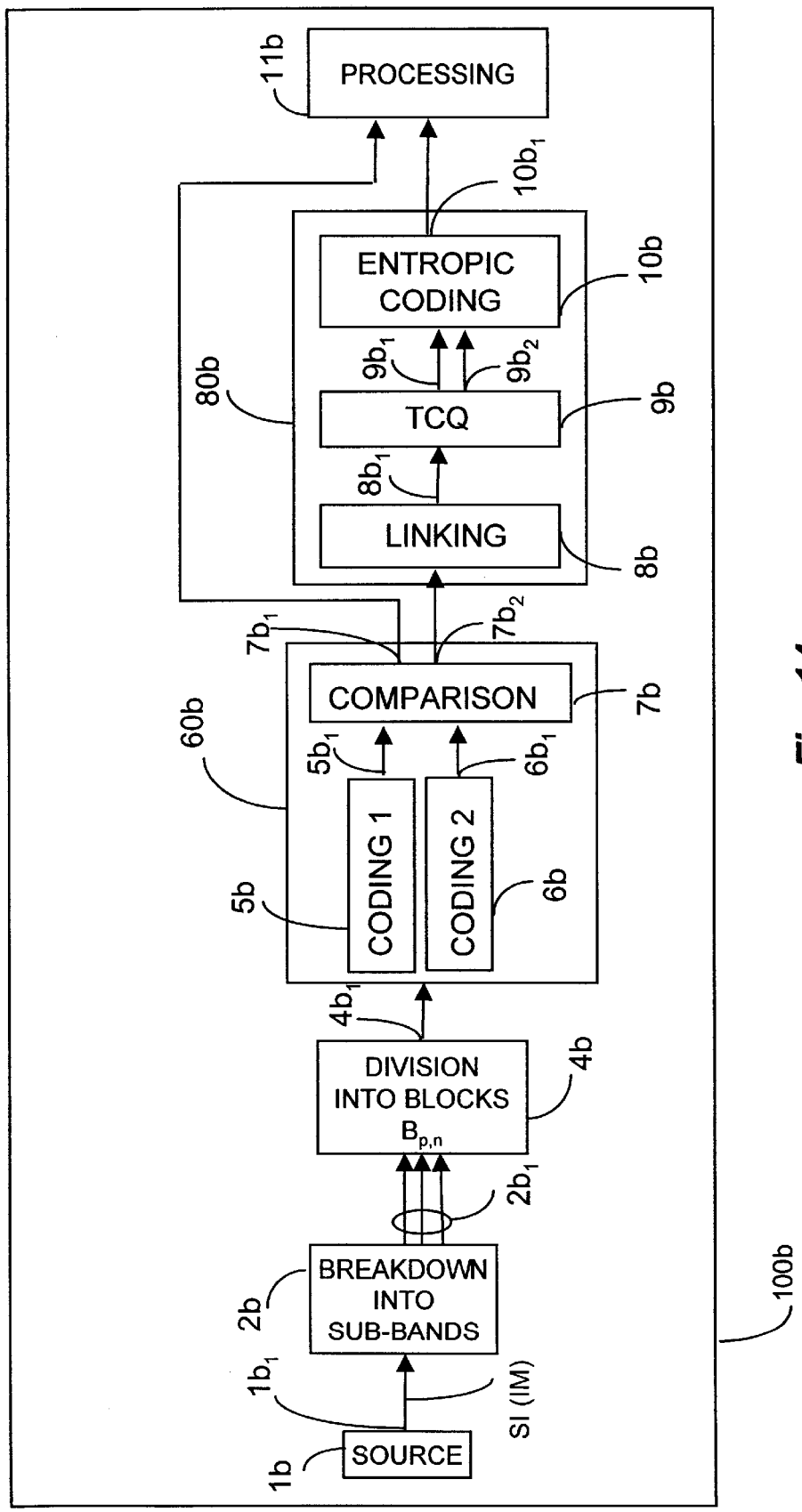
FIG. 14 is a block diagram of a third embodiment of a digital signal coding device according to the invention.

According to the third embodiment chosen and depicted in FIG. 14, a coding device according to the invention is designed to code a digital signal for the purpose of compressing it. The coding device is integrated into an apparatus 100b, which is for example a digital photographic apparatus, or a digital camcorder, or a database management system, or again a computer.

The digital signal to be compressed S1 is in this particular embodiment a series of digital samples representing an image.

The device has a signal source 1b, here an image signal source which is similar to the source 1 previously described (FIG. 1). An output $1b_1$ of the signal source is connected to a analysis circuit or a circuit for breaking down into sub-bands 2b. The breakdown circuit 2b has outputs $2b_1$ connected to a circuit for dividing into blocks 4b. The circuit 4b has outputs $4b_1$ connected to a selection circuit 60b.

The selection circuit 60b includes several coding circuits, for example first and second circuits 5b and 6b, which code the blocks received from the circuit 4b according to first and second coding modes. The first coding mode is here a setting of the coefficients of the blocks to a predetermined value, for example nil, and the second coding mode is a scalar coded quantization of the coefficients of each of the blocks.

An output $5b_1$ of the circuit 5b and an output $6b_1$ of the circuit 6b are connected to a comparison circuit 7b, a first output $7b_1$ of which is connected to a processing circuit 11b and a second output $7b_2$ of which is connected to a coding circuit 80b. The functioning of the selection circuit 60b will be disclosed below.

The coding circuit 80b includes a linking circuit 8b. The latter has an output 8b, connected to a circuit 9b for coding by trellis coded quantization, or TCQ.

The circuit 9b has outputs $9b_1$ and $9b_2$ connected to an entropic coding circuit 10b, an output $10b_1$ of which is connected to the processing circuit 11, which is for example a transmission circuit or a memory.

The circuit for breaking down into sub-bands 2b and the circuit 4b are respectively similar to the circuits 2 and 4 previously described (FIG. 1).

The selection circuit 60b selects the first or second coding mode for each of the blocks supplied by the circuit 4b, as detailed below.

The first coding mode (circuit 5b) consists of setting all the coefficients of the block to a predetermined value, for example the value zero.

This coding is very economical in numbers of bits, since it entails the transmission or storage of no coding data, and consequently requires a reduced transmission rate. However, there is a risk that the coding error may be great if the block under consideration does not have low energy.

The second coding mode (circuit 6b) is a uniform scalar quantization of each of the coefficients of the block and then coding of the indices resulting from the quantization by an entropic coding, for example a Huffman coding.

For each of the blocks, the circuit 7b compares the two codings according to a criterion for selecting the most appropriate coding, according to this criterion, for each block considered. To this end, the circuit 60b iteratively performs the following operations. The circuit 7b determines the rates $R_{1,p,n}$ and $R_{2,p,n}$ necessary for transmitting the block coded by each of the two circuits 5b and 6b, as well as the coding errors, or distortion, $D_{1,p,n}$ and $D_{2,p,n}$ caused by the coding performed by each of the two circuits 5b and 6b. The errors $D_{1,p,n}$ and $D_{2,p,n}$ measure respectively the quadratic error imparted to the reconstructed image by the coding of the block under consideration, according to the first and second coding modes. Where the breakdown into sub-bands is orthogonal, the errors $D_{1,p,n}$ and $D_{2,p,n}$ are equal to the quadratic errors between the original block and the reconstructed block.

The circuit 7b next compares, for each of the blocks, the sums $R_{1,p,n}+\lambda.D_{1,p,n}$ and $R_{2,p,n}+\lambda.D_{2,p,n}$, where $\lambda$ is a coefficient for setting the compression/distortion ratio. The coding for which the sum is the lowest is selected, for each of the blocks under consideration.

Figure 16:
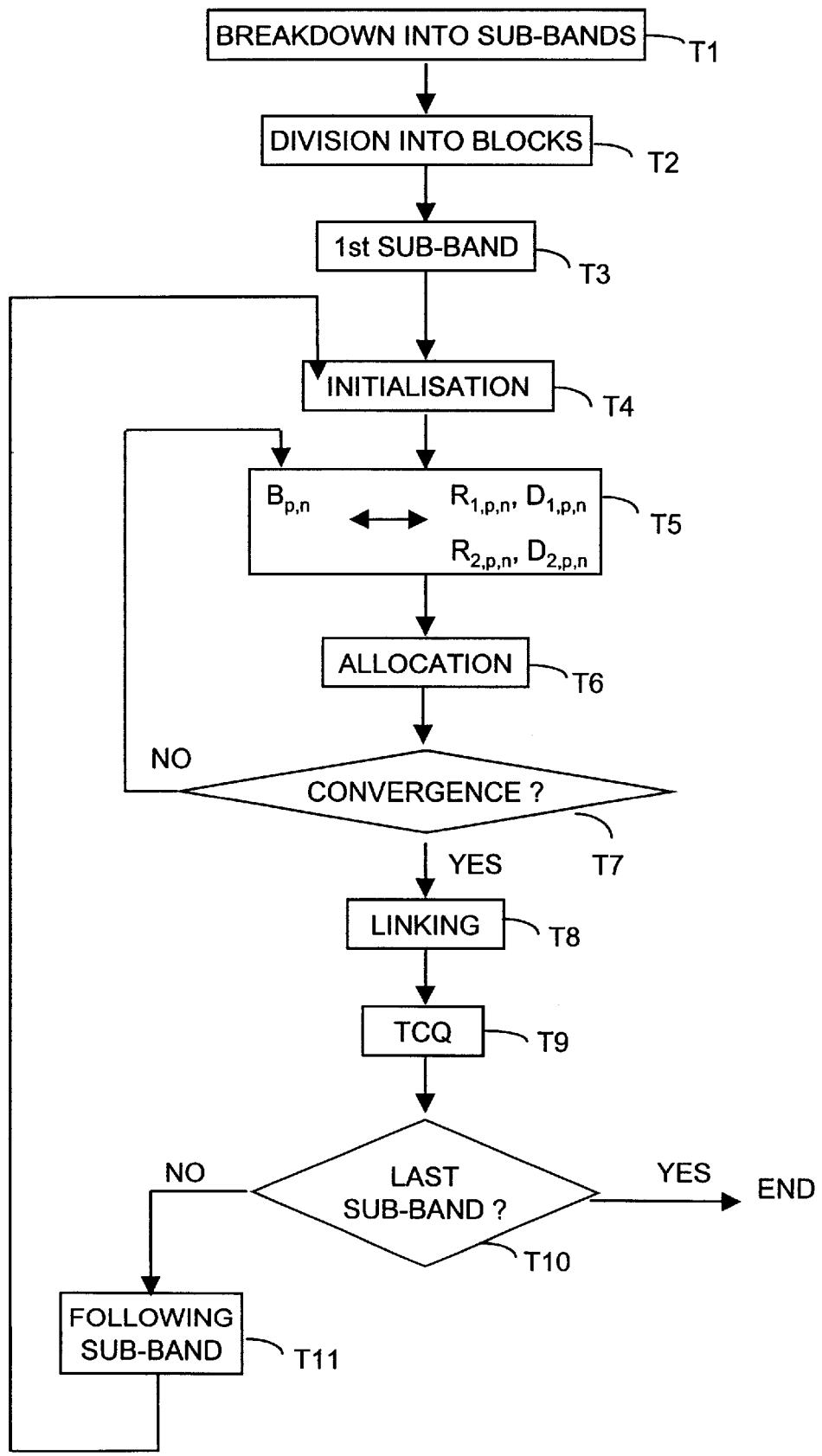
FIG. 16 is a digital signal coding algorithm according to the third embodiment of the invention.

The iterative selection of the coding mode is detailed below (FIG. 16).

An indicator $I_{p,n}$ is associated with each of the blocks in order to indicate which is the coding selected by the circuit 7b. The indicator $I_{p,n}$ is for example a bit which is set to zero if the block under consideration is coded by setting to zero, and which is set to one otherwise. The indicator $I_{p,n}$ forms part of the coded form of the block under consideration.

The circuits 5b, 6b and 7b thus effect a separation of the pertinent information and the non-pertinent information. The blocks to be coded by setting to zero, that is to say the non-pertinent information, have their indicator $I_{p,n}$ as the coded form. The other blocks, that is to say the pertinent information, will then be coded by the circuits 8b, 9b and 10b.

The operations of the circuits 8b, 9b and 10b are similar to those of circuits 8, 9 and 10 previously described.

The circuit 80b transmits to the processing circuit 11b the indicators $I_{p,n}$ of each of the coded blocks, associated with the coded series of blocks.

Figure 15:
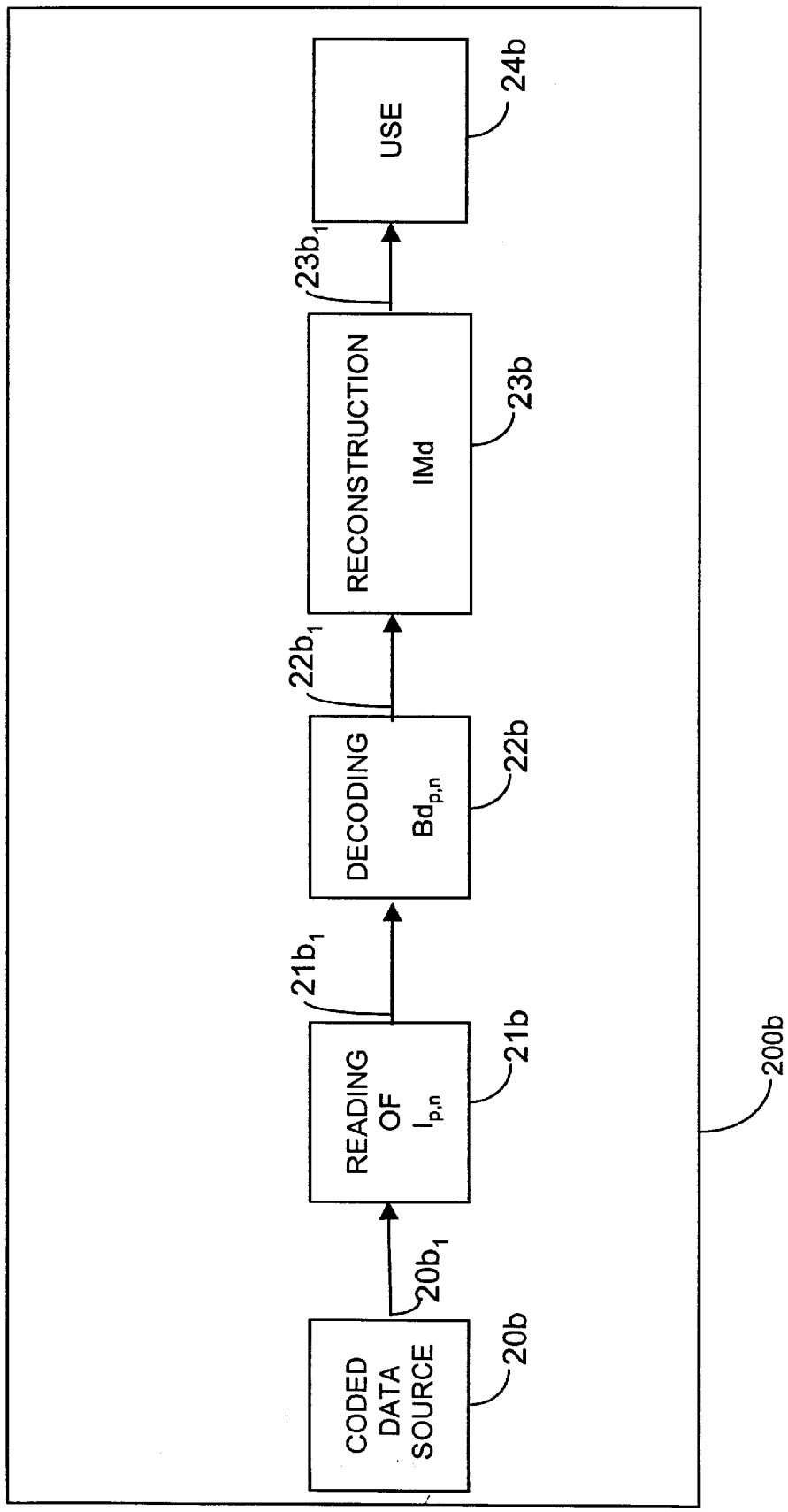
FIG. 15 is a block diagram of a third embodiment of a decoding device according to the invention.

With reference to FIG. 15, the decoding device according to the third embodiment of the invention performs operations overall which are the reverse of those of the coding device. The decoding device is integrated into an apparatus 200$b$, which is for example a digital image reader, or a digital video sequence reader, or a database management system, or again a computer.

One and the same apparatus may include both the coding device and the decoding device according to the invention, so as to perform coding and decoding operations.

The decoding device has a coded data source 20$b$ which includes for example a receiving circuit associated with a buffer memory.

An output 20$b_1$ of the circuit 20$b$ is connected to a circuit 21$b$ for reading an indicator $I_{p,n}$ an output 21$b_1$ of which is connected to a decoding circuit 22$b$.

The decoding circuit 22$b$ has an output 22$b_1$ connected to a reconstruction circuit 23$b$. The latter has an output 23$b_1$ connected to a circuit 24$b$ for using the decoded data, including for example image display means.

The circuit 20$b$ supplies coded data to the circuit 21$b$, which determines the coding mode used for each of the blocks by analysing the indicator $I_{p,n}$.

If the indicator $I_{p,n}$ indicates that the block under consideration is coded by setting to zero, its decoding consists of creating a block, all the coefficients of which are at the value zero. The size of the block created depends on the sub-band currently being decoded.

If the indicator $I_{p,n}$ indicates that the block under consideration is coded by trellis coded quantization, the circuit 22$b$ performs overall operations which are the reverse of those performed at coding. For each symbol to be decoded, the transition i(k) is decoded in order to determine a code vector dictionary, and the index j(k) is decoded to determine a code vector in this dictionary. The set of decoded symbols forms a decoded block.

The circuit 22$b$ supplies the decoded blocks $Bd_{p,n}$ to the reconstruction circuit 23$b$, which is a synthesis circuit corresponding to the analysis circuit 2$b$ described previously, and reconstructs the image IMd corresponding to the decoded sub-bands.

According to a preferred embodiment of the invention, the circuits for breaking down into sub-bands 2$b$, for dividing into blocks 4$b$, for selecting 60$b$, for coding 80$b$ and for processing 11$b$, all included in the coding device depicted in FIG. 14, are implemented by means of a microprocessor associated with random access and read-only memories. The read-only memory contains a program according to the invention for coding each of the blocks of data, and the random access memory contains registers adapted to record variables modified during the running of the program.

The coding program can be stored wholly or partly in any information storage means capable of cooperating with the microprocessor. This storage means can be read by a computer or by a microprocessor. This storage means is or is not integrated into the device, and can be removable. For example it may include a magnetic tape, a diskette or a CD-ROM (fixed-memory compact disc).

Likewise, the reading 21$b$, decoding 22$b$ and reconstruction 23$b$ circuits included in the decoding device depicted in FIG. 15 are implemented by a second microprocessor associated with random access and read only memories. The read only memory contains a program according to the invention for decoding each of the blocks of data, and the random access memory contains registers adapted to record variables modified during the running of the program.

The decoding program can be stored wholly or partly in any information storage means capable of cooperating with the microprocessor. This storage means can be read by a computer or by a microprocessor. This storage means is or is not integrated into the device, and can be removable. For example it may include a magnetic tape, a diskette or a CD-ROM (fixed-memory compact disc).

With reference to FIG. 16, a method according to the invention of coding an image IM, implemented in the coding device, includes steps T1 to T11. The coding method uses two coding modes which can be allocated to the blocks according to a criterion.

Step T1 is the breakdown of the image IM into sub-bands, as shown in FIG. 4. Step T1 results in the sub-bands $LL_3$, $HL_3$, $HL_3$ and $HH_3$ with the lowest resolution $RES_3$, the sub-bands $LH_2$, $HL_2$, $HH_2$ of intermediate resolution $RES_2$, and the sub-bands $LH_1$, $HL_1$ and $HH_1$ with the highest resolution $RES_1$. As disclosed above, the breakdown into sub-bands is not essential for the invention.

Step T1 is followed by step T2, which is the division of the sub-bands into blocks $B_{p,n}$, as shown in FIG. 5.

The following step T3 is an initialisation for considering the first sub-band. The sub-bands are taken into account in an order which is in principle random, whilst being predetermined. Each sub-band is processed independently of the other sub-bands.

The following step T4 is an initialisation at which the indicator $I_{p,n}$ of each of the blocks $B_{p,n}$ of the current sub-band is set to a value indicating that the block is coded by the second coding mode, namely by scalar quantization.

Step T4 is followed by step T5, which is the updating of the rates and distortions, for each of the blocks in the sub-band under consideration.

At this step, the following are calculated and stored:
the rate $R_{1,p,n}$ associated with the coding of the block $B_{p,n}$ by setting to zero,
the distortion $D_{1,p,n}$ associated with the coding of the block $B_{p,n}$ by setting to zero,
the rate $R_{2,p,n}$ associated with the coding of the block $B_{p,n}$ by scalar quantization, and
the distortion $D_{2,p,n}$ associated with coding of the block $B_{p,n}$ by scalar quantization.

The rate $R_{1,p,n}$ associated with the coding of the block $B_{p,n}$ by setting to zero is nil. The distortion $D_{1,p,n}$ associated with the coding of the block $B_{p,n}$ by setting to zero is equal to the quadratic error of the block. The distortion $D_{2,p,n}$ associated with the coding of the block $B_{p,n}$ by scalar quantization is equal to the quadratic error of the dequantized block. These three quantities are calculated only once, when step T5 is first passed through. This is because these quantities do not vary during the subsequent coding iterations.

The blocks to which the scalar quantization is allocated are grouped so as to form a set, or group, of blocks to be coded. At the first iteration, all the blocks of the sub-band under consideration form part of the group to be coded by scalar quantization.

The coding rate $R_{2,p,n}$ of the block $B_{p,n}$ is determined. For this purpose, the blocks of the group under consideration are coded by scalar quantization, then an entropic coder is determined adapted to the distribution of the symbols resulting from the scalar quantization of the group under consideration, and then this entropic coder is applied to the quantized block $B_{p,n}$, in order to determine its rate.

The following step T6 is the allocation, for each of the blocks in the sub-band in the course of processing, of the coding mode which is the most suited to it, according to a criterion. The criterion consists of minimising a coding cost, which is in general terms a function of the rate and distortion.

According to a preferred embodiment, the coding cost is the sum $R_{j,p,n}+\lambda.D_{j,p,n}$, where $\lambda$ is a coefficient for adjusting the compression/distortion ratio, and j is an integer equal to 1 or 2, representing the first or second coding mode.

The coefficient $\lambda$ varies from zero to infinity. For practical reasons, the sum $(1-\lambda).R_{j,p,n}+\lambda.D_{j,p,n}$ can be used in an equivalent fashion, with the coefficient $\lambda$ varying between zero and one.

The coding mode which minimises the sum $R_{j,p,n}+\lambda.D_{j,p,n}$ is selected for coding the block under consideration $B_{p,n}$. Consequently the value of the indicator $I_{p,n}$ of the block under consideration is updated.

The following step T7 is a convergence test. This test consists of checking whether the same coding modes are allocated to the same blocks, in the course of several, for example two, successive repetitions of steps T5 and T6.

As long as the convergence test is not satisfied, step T7 is followed by step T5. When the convergence test is satisfied, step T7 is followed by step T8.

As a variant, a maximum number of repetitions of steps T5 and T6 is predetermined, so as to limit the duration of coding.

The step T8 is a linking of the blocks to which scalar quantization was allocated. The blocks are for example considered from left to right and from top to bottom, in the frequency band under consideration. The result of the step E8 is a series of blocks to be coded $\{B_n\}$.

The following step T9 is the trellis coded quantization of the series of blocks to be coded formed at the previous step. The coding is effected as previously disclosed (FIG. 6) and can be followed by an entropic coding of the binary series obtained.

The result of coding the sub-band under consideration is a set of indicators indicating, for each block, which coding mode was allocated to it after convergence, and the series of data coded by trellis coded quantization.

The allocation of scalar quantization to the blocks is good approximation of the allocation of the trellis coded quantization coding mode and has the advantage of being simpler and faster to implement.

The following step T10 is a test for determining whether all the sub-bands had been processed. If there remains at least one sub-band to be processed, the step T10 is followed by the step T11 in order to consider the following the sub-band. The step T11 is followed by the previously described step T4.

As a variant, the steps of linking and coding by trellis coded quantization are carried out after a positive response at step T10, that is to say when a coding mode has been allocated to all the blocks of all the sub-bands. It is possible to form one series of blocks per sub-band, or to form only one series of blocks for all the sub-bands, and then to effect coding by trellis coded quantization of the series of blocks.

Figure 17:
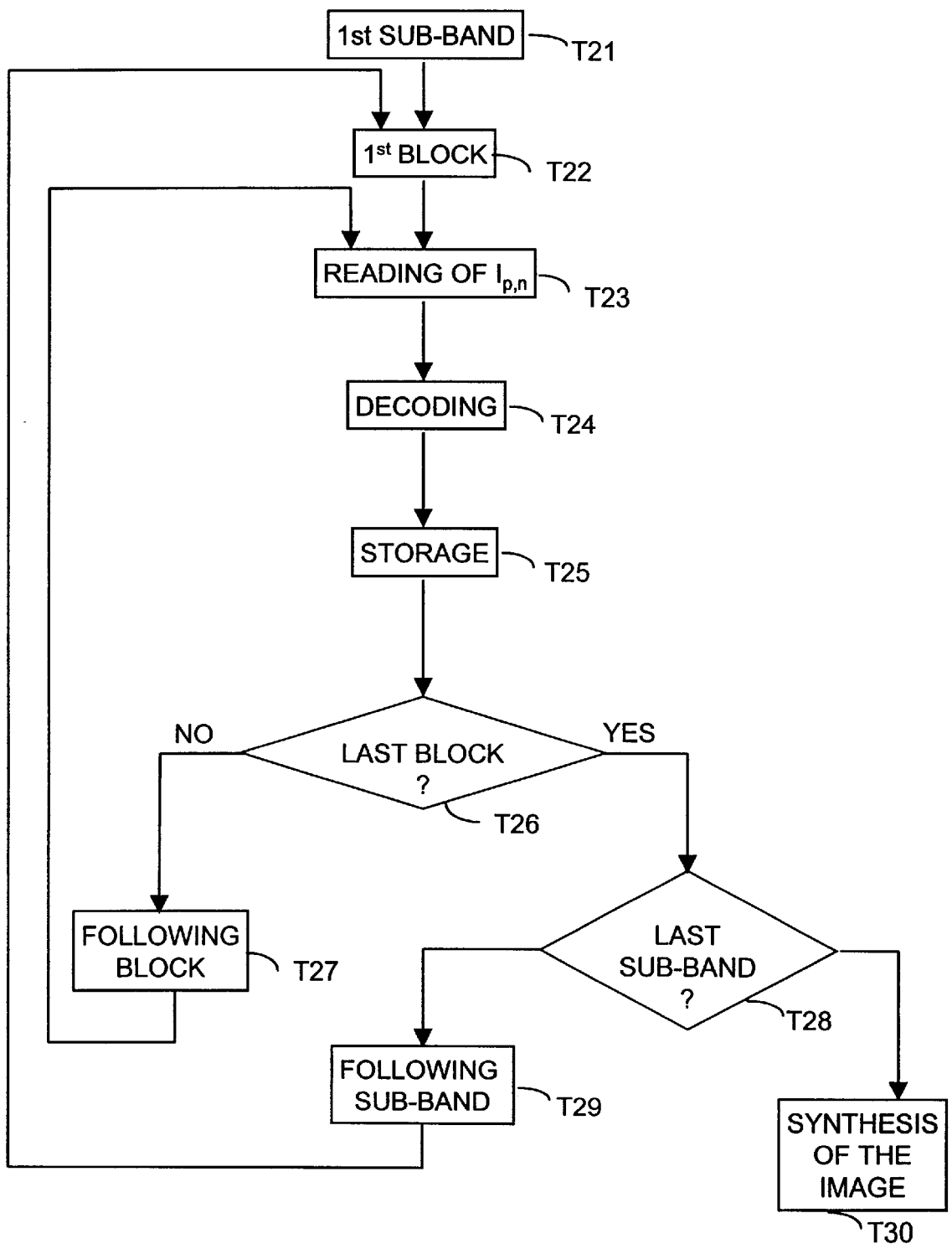
FIG. 17 is a digital signal decoding algorithm according to the third embodiment of the invention.

With reference to FIG. 17, a method according to the invention for decoding an image IM, implemented in the decoding device, comprises steps T21 to T30.

The step T21 is an initialisation for considering the first sub-band to be decoded.

The step T21 is followed by the step T22, which is an initialisation for considering the first block to be decoded in the current sub-band. The sub-bands are decoded in the same order as at coding, and the blocks in a given sub-band are decoded in the same order as at coding, although different orders are possible.

The following step T23 is the reading of the indicator $I_{p,n}$ in order to determine which coding mode was used for coding the current block.

The step T23 is followed the step T24, which is the decoding of the current block. If the block has been coded by setting to zero, the decoding consists of creating a block, all the coefficients of which are at the value zero. The size of the block created depends on the sub-band currently being decoded, and is for example determined by the index of the block. If the block has been coded by trellis coded quantization, operations which are the reverse of those performed at coding are performed. The coding data of the block under consideration are extracted from the series of indices and transitions. For each symbol to be decoded, the transition i(k) is decoded in order to determine a code vector dictionary, and the index j(k) is decoded in order to determine a code vector in this dictionary. The set of decoded symbols forms a decoded block.

The decoded block $Bd_{p,n}$ is stored at the following step T25.

The steps T26 and T28 are tests for verifying whether respectively all the blocks of a sub-band and all the sub-bands have been decoded. If there remains at least one block to be decoded in the current sub-band, the step T26 is followed by the step T27 in order to consider the following block. The step T27 is followed by the previously described step T23.

If there remains at least one sub-band to be decoded, the step T28 is followed by the step T29 in order to consider the following sub-band. The step T29 is followed by the previously described step T23.

When all the sub-bands have been decoded, that is to say when the response is positive at step T28, the latter step is followed by the step T30 of constructing the decoded image. The latter can then be displayed, for example.

Figure 18:
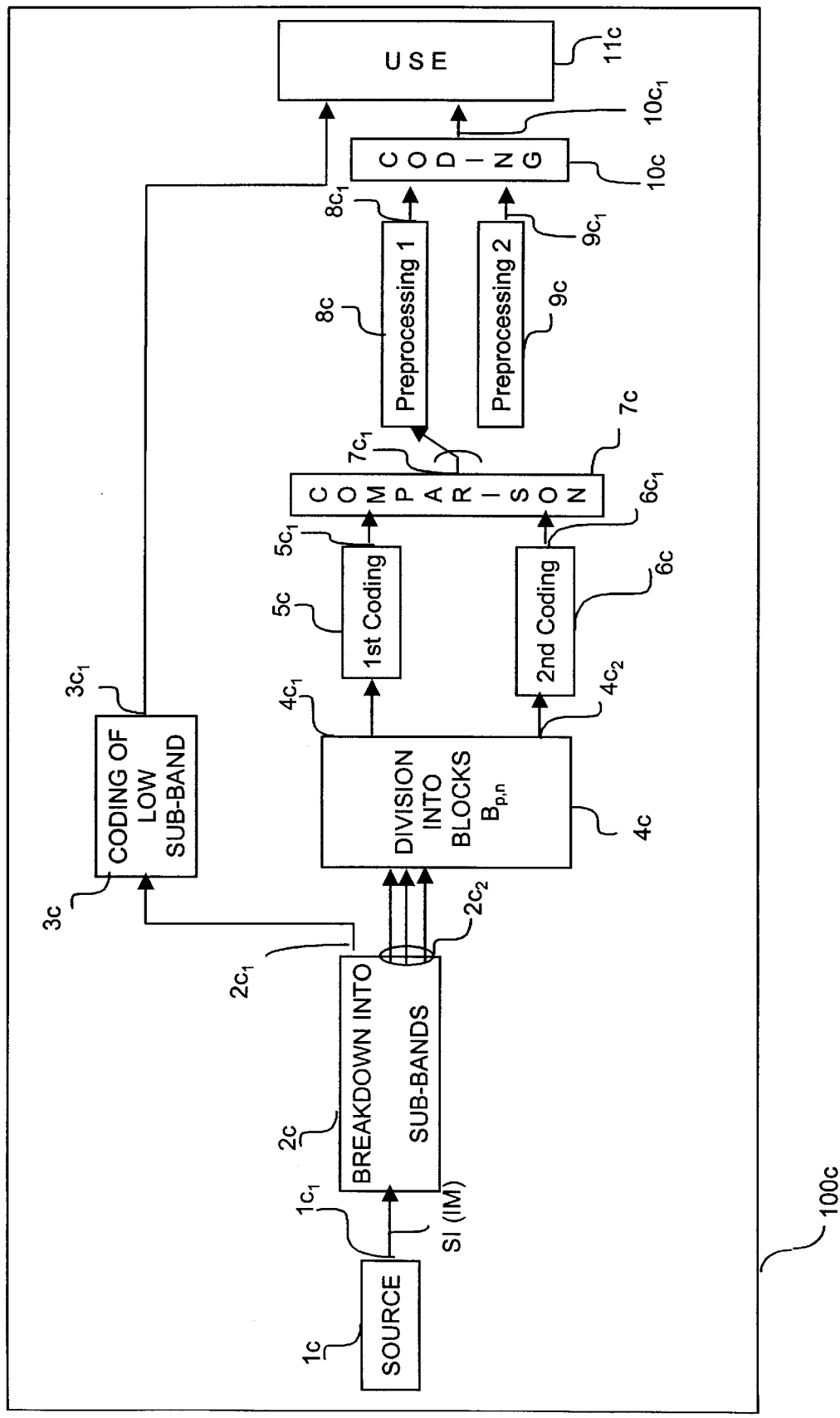
FIG. 18 is a block diagram of a fourth embodiment of a digital signal coding device according to the invention.

According to the fourth embodiment chosen and depicted in FIG. 18, a coding device according to the invention is designed to code a digital signal for the purpose of compressing it. The coding device is integrated into an apparatus 100, which is for example a digital photographic apparatus, or a digital camcorder, or a database management system, or again a computer.

The digital signal to be compressed SI is in this particular embodiment a series of digital samples representing an image.

The device has a signal source 1c, here an image signal source which is similar to the source 1 (FIG. 1). An output $1c_1$ of the signal source is connected to an analysis circuit, or circuit for breaking down into sub-bands 2c. The circuit 2c has a first output $2c_1$ connected to a coding circuit 3c.

Second outputs $2c_2$ of the breakdown circuit 2c are connected to a circuit for dividing into blocks 4c. The circuit 4c has first outputs $4c_1$ connected to a first coding circuit 5c and second outputs $4c_2$ connected to a second coding circuit 6c.

An output $5c_1$ of the circuit 5c and an output $6c_1$ of the circuit 6c are connected to a comparison circuit 7c, an output $7c_1$ of which is selectively connected to a first preprocessing circuit 8c and to a second preprocessing circuit 9c.

Respective outputs $8c_1$ and $9c_1$ of the preprocessing circuits 8c and 9c are connected to a coding circuit 10c, an output $10c_1$ of which is connected to a user circuit 11c, which is for example a transmission circuit, or a memory. An output $3c_1$ of the coding circuit 3c is also connected to the user circuit 11c.

The circuit for breaking down into sub-bands 2c is similar to the circuit 2 (FIG. 2).

The coding circuit 3c is similar to the circuit 3 previously described and performs a DPCM (Differential Pulse Code Modulation) coding of the sub-band of lowest frequency $LL_3$.

The sub-bands $LH_3$, $HL_3$ and $HH_3$, as well as the higher-resolution sub-bands $HL_2$, $LH_2$, $HH_2$, $HL_1$, $LH_1$ and $HH_1$ are supplied to the division circuit 4, in a sub-band order which is a priori arbitrary, but predetermined.

As depicted in FIG. 5, the division circuit 4c divides each detail sub-band into blocks.

The circuits 5c, 6c and 7c are respectively similar to the circuits 5, 6 and 7.

An indicator $I_{p,n}$ is associated with each of the blocks in order to indicate which coding is selected by the circuit 7c. For example, the indicators take the value zero or one according to the coding selected.

According to the value of the indicator $I_{p,n}$ the circuit 7c supplies the block $B_{p,n}$ to the preprocessing circuit 8c or to the preprocessing circuit 9c. The preprocessing circuit 8c performs a first preprocessing which consists of replacing each block $B_{p,n}$ which it receives with a block of the same size having all its coefficients nil.

If the indicator $I_{p,n}$ indicates that the block $B_{p,n}$ is coded by scalar quantization, then the block $B_{p,n}$ is transmitted to the preprocessing circuit 9c, which performs a second preprocessing which consists of leaving the block $B_{p,n}$ unchanged. The preprocessing of the image IM results in sub-bands having nil blocks and blocks identical to those formed by the circuit 4c.

The circuits 8c and 9c supply the preprocessed blocks of each sub-band to the coding circuit 10c, which performs the coding proper of the preprocessed sub-bands according to a third coding mode. It should be noted that no additional information is necessary to indicate which preprocessing has been performed on each of the blocks. In particular, the indicator $I_{p,n}$ is neither transmitted nor stored.

According to a first embodiment, more particularly depicted in FIG. 6, the circuit 10c is a circuit for coding by trellis coded quantization, referred to as TCQ. The circuit 10c is similar to the circuit 9 (FIG. 1).

According to a second embodiment, the coding circuit 10c performs a scalar quantization of each of the sub-bands, followed by an entropic coding of the quantization indices obtained.

According to a third embodiment, the coding circuit 10c performs a vector quantization of each of the sub-bands.

In a variant, the second coding mode (circuit 6c) and the third coding mode (circuit 10c) are identical, which simplifies the structure of the coding device according to the invention.

In all cases, the user circuit 11c receives the coded image, for example in order to transmit and/or store it.

Figure 19:
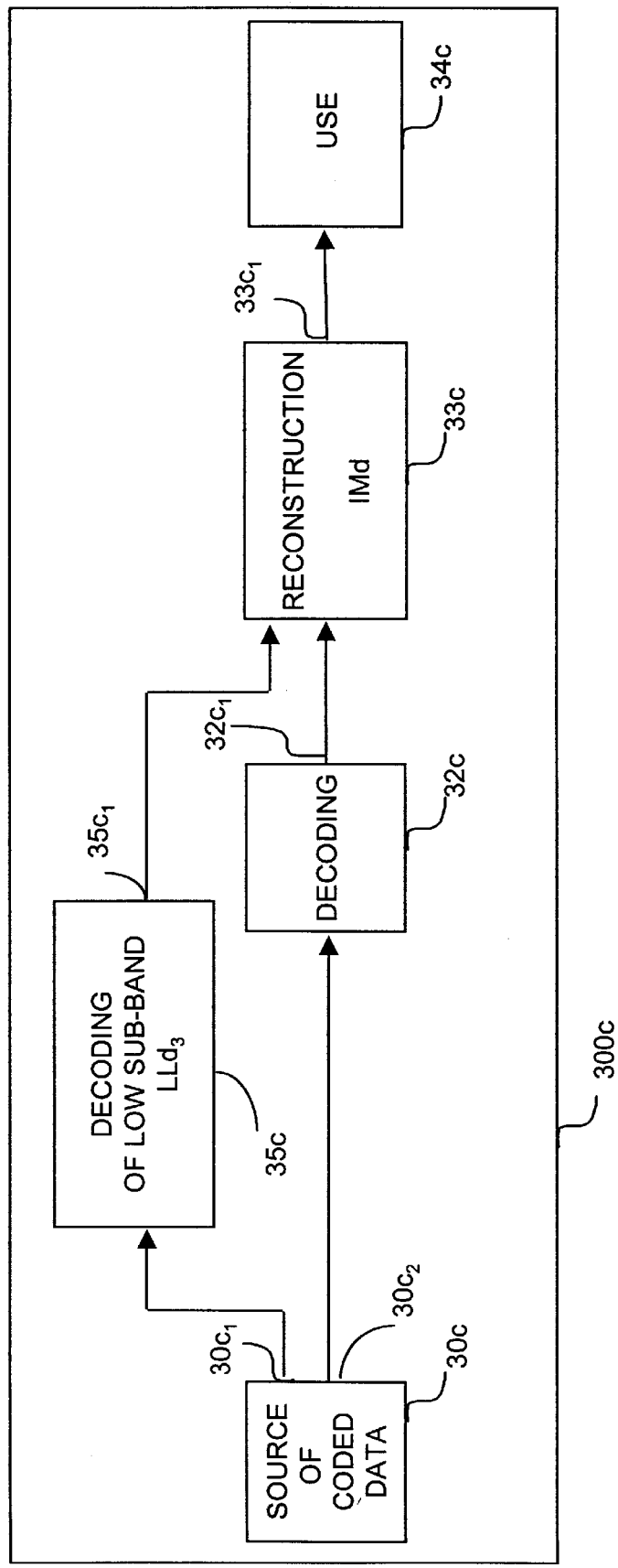
FIG. 19 is a block diagram of a fourth embodiment of a decoding device according to the invention.

With reference to FIG. 19, the decoding device performs operations overall which are the inverse of those of the coding device. The decoding device is integrated into an apparatus 300c, which is for example a digital image reader, or a digital video sequence reader, or a database management system, or again a computer.

One and the same apparatus may include both the coding device and the decoding device according to the invention, so as to perform coding and decoding operations.

The decoding device has a coded data source 30c which includes for example a receiving circuit associated with a buffer memory.

A first output 30c, of the circuit 30c is connected to a decoding circuit 32c.

The decoding circuit 32c has an output $32c_1$ connected to a reconstruction circuit 33c. The latter has an output $33c_1$ connected to a circuit 34c for using the decoded data, including for example image display means.

The circuit 30c supplies coded data to the circuit 32c, which reads and decodes the coding data for each block in order to form a decoded block. The decoding depends on the coding which was previously performed by the circuit 10c. The circuit 32c performs overall operations which are the inverse of those performed at coding.

According to the first embodiment (trellis coded quantization), for each symbol to be decoded, the transition i(k) is read in order to determine a code vector dictionary and the index j(k) is read to determine a code vector in this dictionary. The set of decoded symbols forms a decoded block.

According to the second embodiment, the data coded by Huffman coding are read and decoded. The quantization indices corresponding to the coefficients of the block currently being decoded are extracted. The indices are dequantized in order to generate the coefficients of the decoded block $Bd_{p,n}$.

According to the third embodiment, the decoding of each block includes the reading of the index of the block in order to find the corresponding code vector in the code vector dictionary.

The circuit 32c supplies the decoded blocks $Bd_{p,n}$ to the reconstruction circuit 33c, which is a synthesis circuit corresponding to the analysis circuit 2c described previously, and reconstructs the image IMd corresponding to the decoded sub-bands.

A second output $30c_2$ of the circuit 30c is connected to a circuit 35c for decoding the sub-band of lowest frequency, a first output $35c_1$ of which is connected to the reconstruction circuit 33c.

The decoding circuit 35c performs operations which are the inverse of those of the coding circuit 3c, and supplies the decoded sub-band $LLd_3$ to the reconstruction circuit 3c.

According to a preferred embodiment of the invention, the circuits for breaking down into sub-bands 2c, for coding 3c, for dividing into blocks 4c, for coding 5c and 6c, for comparison 7c, for preprocessing 8c and 9c, for coding 10c and for use 11c, all included in the coding device depicted in FIG. 18, are implemented by means of a microprocessor associated with random access and read-only memories. The read-only memory contains a program for coding each of the blocks of data, and the random access memory contains registers adapted to record variables modified during the running of the program.

Likewise, the circuits for decoding 32c and 35c and reconstruction 33c, included in the decoding device depicted in FIG. 19, are implemented by means of a second microprocessor associated with random access and read-only memories. The read-only memory contains a program for decoding each of the blocks of data, and the random access memory contains registers adapted to record variables modified during the running of the program.

Figure 20:
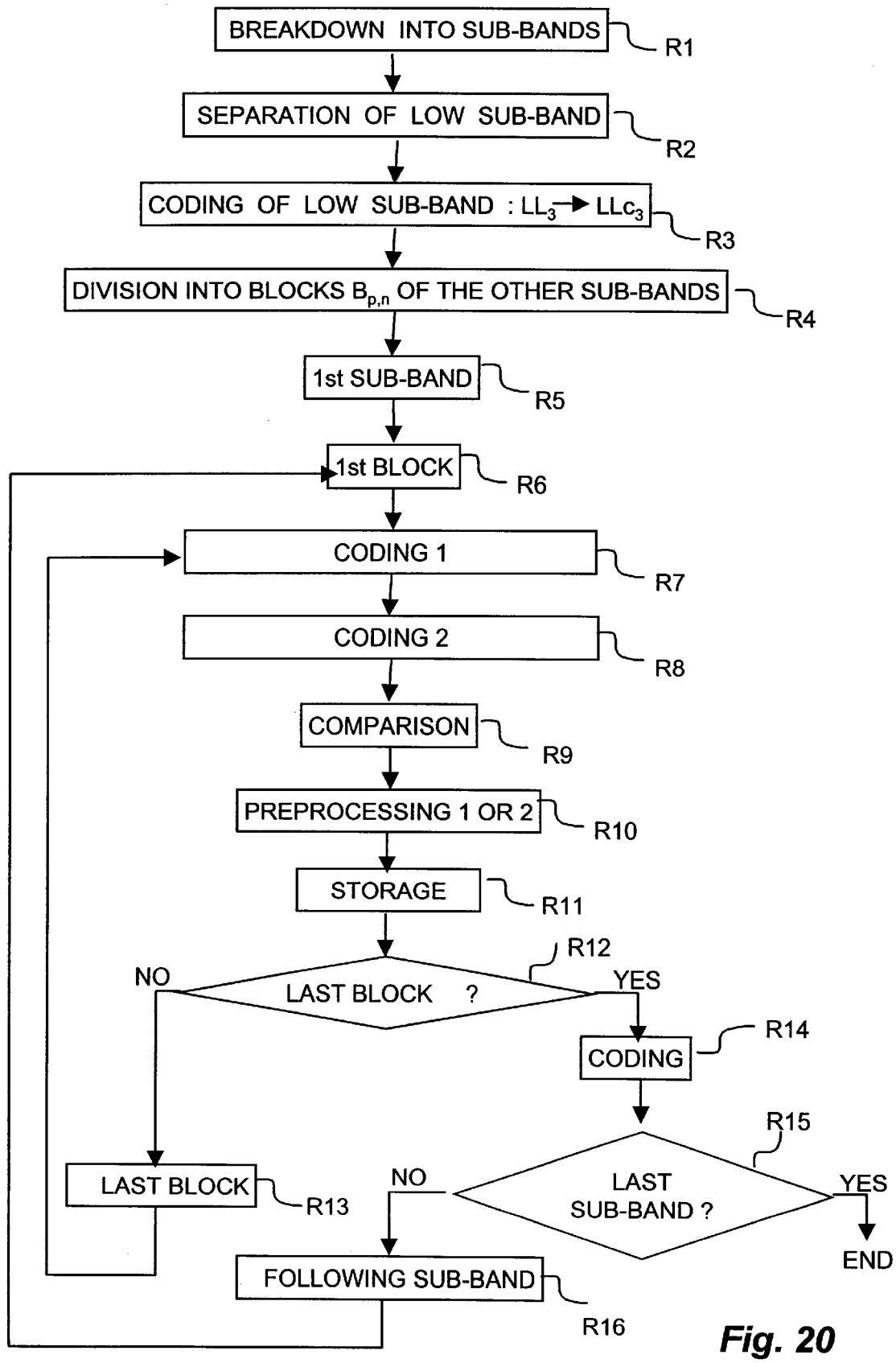
FIG. 20 is a coding algorithm for a digital signal according to the fourth embodiment of the invention.
Figure 21:
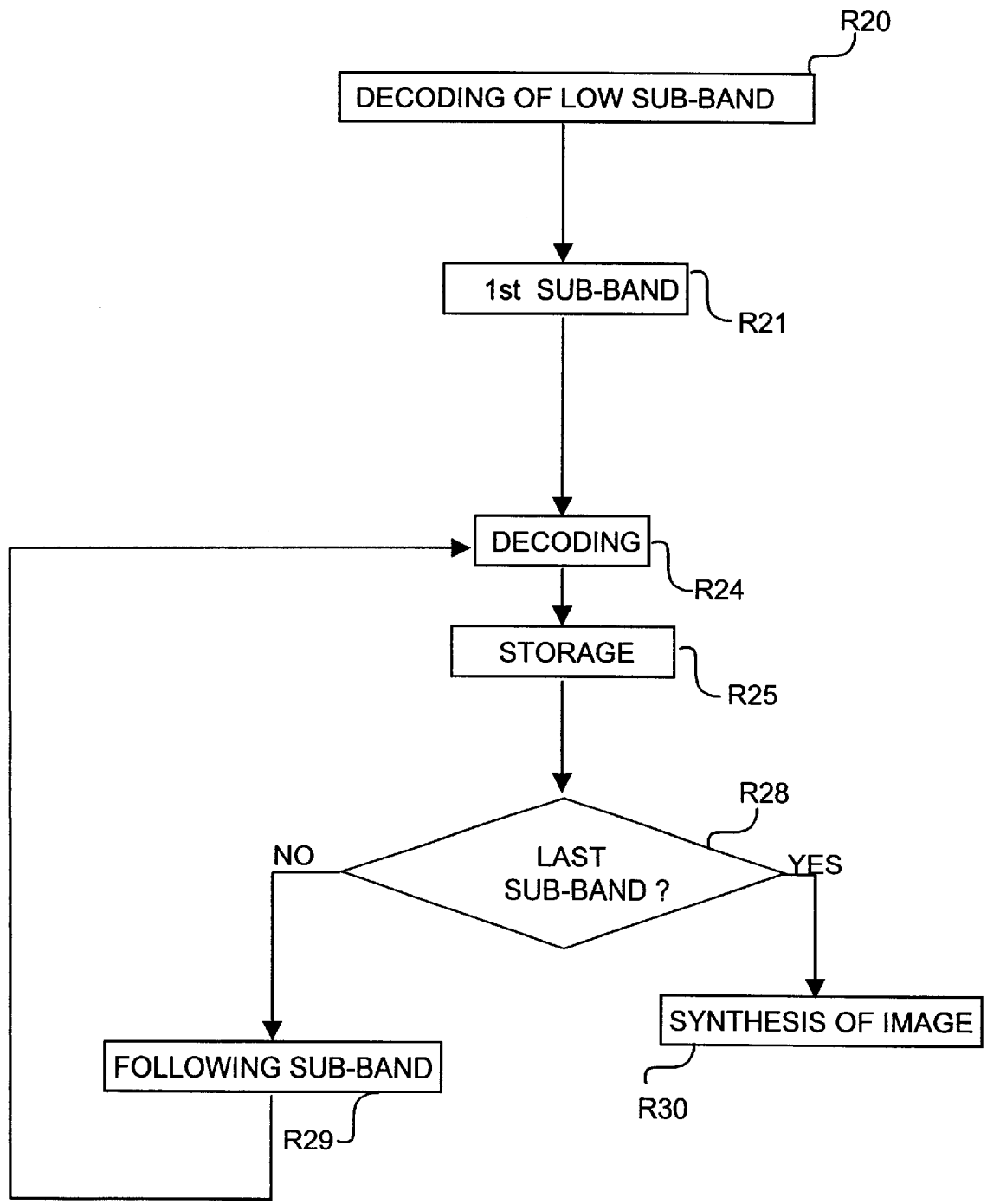
FIG. 21 is a decoding algorithm for a digital signal according to the fourth embodiment of the invention.

With reference to FIG. 20, a method according to the fourth embodiment of the invention for coding an image IM, implemented in the coding device, includes steps R1 to R16.

Step R1 is the breakdown of the image IM into sub-bands, as depicted in FIG. 4. Step R1 results in the sub-bands $LL_3$, $HL_3$, $LH_3$ and $HH_3$ of lowest resolution $RES_3$, the sub-bands $LH_2$, $HL_2$, $HH_2$ of intermediate resolution $RES_2$, and the sub-bands $LH_1$, $HL_1$ and $HH_1$ of highest resolution $RES_1$.

The sub-band $LL_3$ is separated from the other sub-bands at the following step R2.

The step R3 codes the sub-band $LL_3$ according to a DPCM (Differential Pulse Code Modulation) coding, and results in the coded sub-band $LLc_3$, which is stored and/or transmitted.

The step R3 is followed by the step R4, which is the division of the other sub-bands into blocks $B_{p,n}$ as depicted in FIG. 5.

The following step R5 is an initialisation for considering the first sub-band. The sub-bands are taken into account in an order which is a priori arbitrary, whilst being predetermined.

The following step R6 is an initialisation for considering the first block of the current sub-band. The blocks of the current sub-band are taken into account in an arbitrary and predetermined order.

The step R6 is followed by the step R7, which is coding by a first coding mode, in this embodiment by setting the coefficients of the current block $B_{p,n}$ to a predetermined value, here zero. The following step R8 is the coding, by a second coding mode, here scalar quantization, of the current block $B_{p,n}$.

The following step R9 is the comparison of the two coding modes, for the current block, according to a predetermined criterion. The step R9 results in allocating an indicator $I_{p,n}$ to the current block $B_{p,n}$ in order to indicate which preprocessing is to be performed for this block. The indicator $I_{p,n}$ takes for example the value zero if coding by zeroing is chosen for the block in question, and the value one if scalar quantization is chosen for the block in question.

To this end, the sums $R_{1,p,n}+\lambda.D_{1,p,n}$ and $R_{2,p,n}+\lambda.D_{2,p,n}$ are calculated, where $R_{1,p,n}$ and $R_{2,p,n}$ are the rates necessary for transmitting the current block coded by the two modes, $D_{1,p,n}$ and $D_{2,p,n}$ are the distortions caused in the current block by the two coding modes, and $\lambda$ is a coefficient for setting the compression/distortion ratio. As disclosed above, the errors $D_{1,p,n}$ and $D_{2,p,n}$ measure respectively the quadratic error imparted to the image reconstructed by the coding of the block in question, according to the first and second coding modes. The coding for which the sum is the lowest is selected, for the current block.

At the following step R10, a preprocessing is performed on the current block $B_{p,n}$ according to the value of its indicator $I_{p,n}$. A first preprocessing mode is a zeroing of all the coefficients of the block if the block contains non-pertinent information, that is to say if coding by zeroing was selected at step R9. A second preprocessing mode is identity if the block contains pertinent information, that is to say if the second coding mode was selected at step R9.

The following step R11 is the storage of the preprocessed current block.

Steps R12 and R15 are tests for verifying respectively whether all the blocks of a sub-band and all the sub-bands have been coded. If there remains at least one block to be coded in the current sub-band, the step R12 is followed by the step R13 in order to consider the following block. The step R13 is followed by the previously described step R7.

When all the blocks of a sub-band have been processed, the step R12 is followed by the step R14, which is the coding of the sub-band under consideration.

According to the first embodiment, the step R14 is the coding by trellis coded quantization of the series of blocks of the sub-band under consideration. Coding is performed as previously disclosed (FIG. 6), and can be followed by an entropic coding of the binary series obtained.

According to the second embodiment, the step R14 is a coding by scalar quantization of the sub-band under consideration.

According to the third embodiment, the step R14 is the vector quantization of the sub-band under consideration.

If there remains at least one sub-band to be coded, step R15 is followed by step R16 in order to consider the following sub-band. Step R16 is followed by the previously described step R6.

With reference to FIG. 20, a method of decoding an image IM according to the fourth embodiment of the invention, implemented in the decoding device, comprises the steps R20 to R30.

The step R20 is the decoding of the low sub-band $LLc_3$ in order to form a decoded low sub-band $LLd_3$ which is stored.

The following step R21 is an initialisation for considering the first detail sub-band to be decoded. The sub-bands are decoded in the same order as at coding, although a different order is possible.

The following step R24 is the decoding of the current sub-band.

The decoding depends on the coding which was previously carried out (step R14).

According to the first embodiment (trellis coded quantization), for each symbol to be decoded, the transition i(k) is read in order to determine a code vector dictionary and the index j(k) is read to determine a code vector in this dictionary. The set of decoded symbols forms a decoded block.

According to the second embodiment, the data coded by Huffman coding are read and decoded. The quantization indices corresponding to the coefficients of the block currently being decoded are extracted. The indices are dequantized in order to generate the coefficients of the decoded block $Bd_{p,n}$.

According to the third embodiment, the decoding of each block includes the reading of the index of the block in order to find the corresponding code vector in the code vector dictionary.

The decoded block $Bd_{p,n}$ is stored at the following step R25.

The step R28 is a test for verifying whether all the sub-bands have been decoded. If there remains at least one sub-band to be decoded, the step R28 is followed by the step R29 in order to consider the following sub-band. The step R29 is followed by the previously described step R24.

When all the sub-bands have been decoded, that is to say when the response is positive at the step R28, the latter step is followed by the step R30 of constructing the decoded image. The latter can then be displayed for example.

Naturally, the present invention is in no way limited to the embodiments described and depicted, but quite the contrary encompasses any variant within the capability of persons skilled in the art.

In particular, the invention can easily be applied to other types of signal.

These signals can be mono-dimensional signals such as sounds, or seismic readings, or again electrocardiograms; according to their nature, the signals are analysed according to time frequencies or spatial frequencies.

These signals can be three dimensional, such as video sequences represented in two spatial frequencies and one time frequency. A breakdown into frequency sub-bands in three dimensions is then used, and the breakdown of the signal into vectors is also effected in three dimensionals.

For a signal having components in several frequency bands, such as a colour image signal having red, green and blue components, the invention applies in each of the frequency bands.

What is claimed is:

1. A digital signal coding method including a step of analysing the digital signal into a plurality of frequency sub-bands distributed in at least two different frequency bands, at least one first sub-band having a lower frequency and at least one second sub-band having a higher frequency, including, for each second sub-band, the steps of:

dividing the second sub-band into blocks, selecting first blocks which are to be coded by setting coefficients of each first block to a predetermined value and second blocks which are to be coded by trellis coded quantization, according to a selection criterion, linking the second blocks selected at the previous step in order to form a series of blocks, and coding the series of blocks by trellis coded quantization of a series of coefficients extracted from the second blocks of the second sub-band, wherein, for each of the blocks, the selection step includes:

the coding of the block by setting to the predetermined value and by a second coding mode, the comparison of the coding by setting to the predetermined value and the second coding mode according to the selection criterion, and the selection of the coding by setting to the predetermined value if the block coded by setting to the predetermined value satisfies the selection criterion.

2. The coding method according to claim 1, wherein the second coding mode is a scalar quantization of the coefficients of the block.

3. The coding method according to claim 1, wherein the second coding mode is a trellis coded quantization of a series of coefficients extracted from the blocks of the second sub-band.

4. The coding method according to claim 1, wherein the selection criterion minimises a weighted sum of the transmission rate and of the coding error caused by the coding of the block under consideration.

5. The coding method according to claim 1, wherein an indicator is associated with each block in order to indicate whether or not the block under consideration is coded by setting to the predetermined value.

6. The coding method according to claim 1, wherein said at least one first sub-band is coded according to a third coding mode.

7. A digital signal coding device including means of analysing the digital signal into a plurality of frequency sub-bands distributed in at least two different frequency bands, at least one first sub-band having a lower frequency and at least one second sub-band having a higher frequency, including:

means of dividing each second sub-band into blocks, means of selecting first blocks which are to be coded by setting coefficients of each first block to a predetermined value and second blocks which are to be coded by trellis coded quantization, according to a selection criterion, means of linking the second blocks selected at the previous step in order to form a series of blocks, and means of coding the series of blocks by trellis coded quantization of a series of coefficients extracted from the second blocks of the second sub-band, wherein, for each of the blocks, the selection means are adapted to code the block by setting to the predetermined value and by a second coding mode, to compare the coding by setting to the predetermined value and the second coding mode according to the selection criterion and to select coding by setting to the predetermined value if the block coded by setting to the predetermined value satisfies the selection criterion.

8. The coding device according to claim 7, wherein the selection means are adapted to apply a second coding mode which is a scalar quantization of the coefficients of the block.

9. The coding device according to claim 7, wherein the selection means is adapted to apply a second coding mode which is a trellis coded quantization of a series of coefficients extracted from the blocks of the second sub-band.

10. The coding device according to claim 7, wherein the selection means are adapted to apply a selection criterion which minimises a weighted sum of the transmission rate and of the coding error caused by the coding of the block under consideration.

11. The coding device according to claim 7, wherein the coding device is adapted to associate an indicator with each block in order to indicate whether or not the block under consideration is coded by setting to the predetermined value.

12. The coding device according to claim 7, further comprising means of coding the at least one first sub-band according to a third coding mode.

13. A coding device according to claim 7, wherein the means of division, selection, connection and coding are incorporated in:

a microprocessor, a read-only memory containing a coding program, and a random access memory containing registers adapted to record variables modified during the running of the said program.

14. A digital signal processing apparatus, comprising means adapted to implement the coding method according to claim 1.

15. A digital signal processing apparatus, comprising the coding device according to claim 7.

16. A storage medium storing a program implementing the coding method according to claim 1.

17. A storage medium according to claim 16, wherein said storage medium is a floppy disk or a CD-ROM.

\* \* \* \* \*